(12) United States Patent
Gupta et al.

(10) Patent No.: US 10,288,973 B1
(45) Date of Patent: May 14, 2019

(54) BORDERLESS DISPLAY WITH THIN PROFILE

(71) Applicant: Amazon Technologies, Inc., Seattle, WA (US)

(72) Inventors: Siddharth Gupta, San Bruno, CA (US); Vikram Srinivas, San Jose, CA (US); Robert Arthur Sprague, Saratoga, CA (US); Wilfrido Loor Canizares, San Francisco, CA (US)

(73) Assignee: Amazon Technologies, Inc., Seattle, WA (US)

( * ) Notice: Subject to any disclaimer, the term of this patent is extended or adjusted under 35 U.S.C. 154(b) by 145 days.

(21) Appl. No.: 15/216,558

(22) Filed: Jul. 21, 2016

(51) Int. Cl.
| | |
|---|---|
| G02B 26/00 | (2006.01) |
| G02B 26/08 | (2006.01) |
| G02F 1/29 | (2006.01) |
| G02F 1/167 | (2019.01) |
| G02F 1/1333 | (2006.01) |
| G02F 1/1368 | (2006.01) |
| G02F 1/1335 | (2006.01) |
| H01L 27/12 | (2006.01) |

(52) U.S. Cl.
CPC ............ *G02F 1/167* (2013.01); *G02F 1/1368* (2013.01); *G02F 1/13338* (2013.01); *G02F 1/133305* (2013.01); *G02F 1/133308* (2013.01); *G02F 1/133524* (2013.01); *H01L 27/1218* (2013.01); *G02F 2001/133314* (2013.01); *G02F 2001/133331* (2013.01)

(58) Field of Classification Search
USPC ........ 359/237, 242, 265–267, 290–292, 295, 359/296, 298
See application file for complete search history.

(56) References Cited

U.S. PATENT DOCUMENTS

| | | | |
|---|---|---|---|
| 2006/0172767 A1* | 8/2006 | Cathey, Jr. ............. | G03B 21/00 455/556.1 |
| 2010/0271360 A1* | 10/2010 | Lai ......................... | G09G 3/344 345/211 |
| 2014/0232956 A1* | 8/2014 | Kwon ............... | G02F 1/133305 349/12 |

\* cited by examiner

*Primary Examiner* — Brandi N Thomas
(74) *Attorney, Agent, or Firm* — Lee & Hayes, P.C.

(57) ABSTRACT

A borderless display utilizes a support frame having a bulged periphery (or outer portion), and a flexible electrophoretic display (EPD) structure that is curved at least partly around the support frame. The bulged outer portion of the support frame allows the flexible EPD structure to be wrapped around the outer portion of the support frame without damaging elements of the EPD structure in the process. Meanwhile, the center portion of the support frame can be made thinner, as compared to the thickness of the support frame at the bulged, outer portion. In this manner, the overall profile (in the z-direction) of the electronic device can be made as thin as possible without damaging fragile elements in the EPD structure.

20 Claims, 15 Drawing Sheets

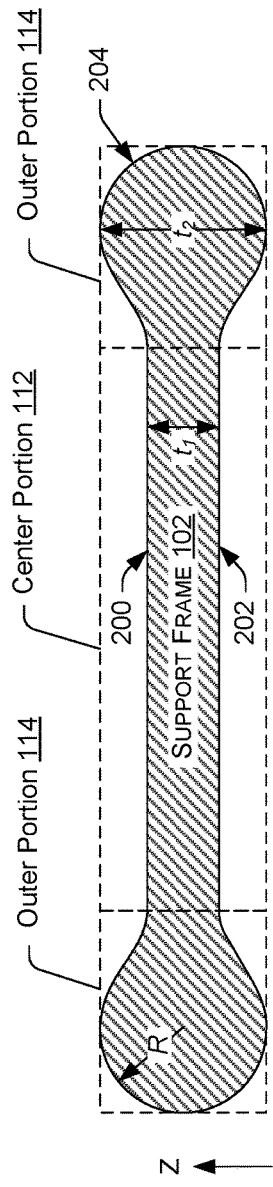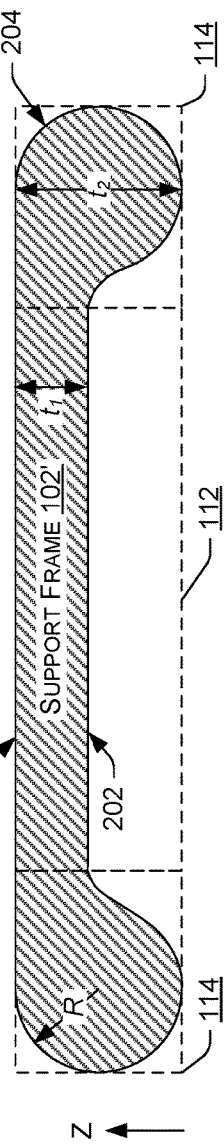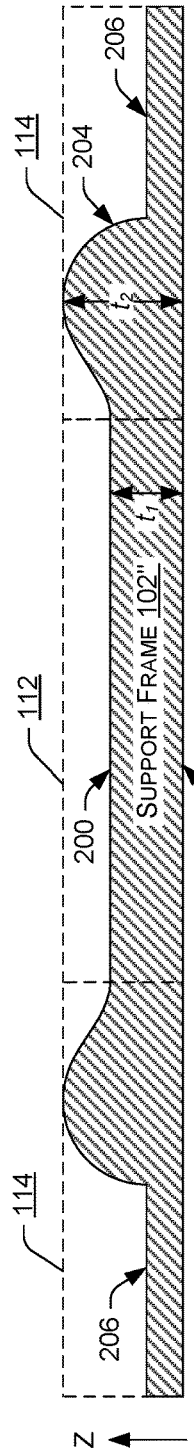

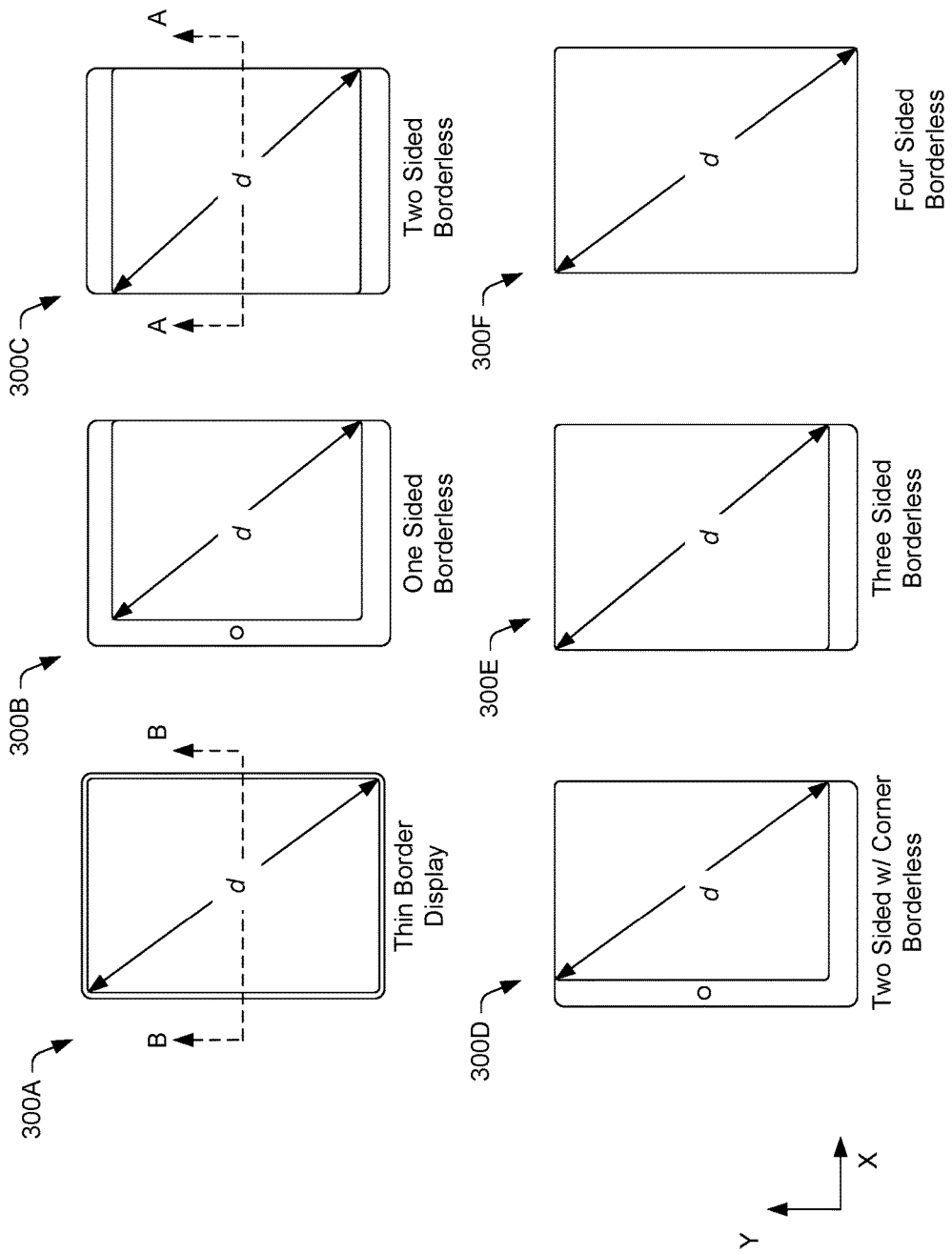

(SECTION A-A)

(Section A-A)

(SECTION A-A)

(SECTION A-A)

(SECTION A-A)

(SECTION A-A)

(Section B-B)

(Section B-B)

BORDERLESS DISPLAY WITH THIN PROFILE

BACKGROUND

Electronic devices often include displays for presenting information to a user. A typical electronic device with a display includes a substantial bezel (or border) on the front face of the device around the display. As such, a rigid (e.g., glass) backplane in the display stack can extend to the bezel, but can otherwise stop short of the edges of the electronic device, leaving room for additional components to be situated behind the bezel.

To make the display appear "borderless," the aforementioned rigid backplane of the display stack can be replaced with backplane made of a flexible material (e.g., a polymer), which can then be wrapped around one or more edges of the electronic device, thereby eliminating the need for a bezel or border on the front face. However, as design trends for electronic devices progress to thinner and thinner dimensions, the extent to which the thickness of the device can be reduced is constrained by the bend radius of the flexible backplane in the aforementioned borderless configuration. That is, if the flexible backplane is wrapped around an edge of the electronic device at a radius of curvature that is too small, elements of the flexible backplane (e.g., thin film transistor (TFT) traces) can fracture or otherwise fail, rendering at least a portion of the display inoperable. This constraint causes borderless displays to be thicker than necessary.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

FIG. 2A illustrates a side, cross-sectional view of an example support frame for a borderless electrophoretic display of an electronic device.

FIG. 2B illustrates a side, cross-sectional view of another example support frame for a borderless electrophoretic display of an electronic device.

FIG. 2C illustrates a side, cross-sectional view of another example support frame for a borderless electrophoretic display of an electronic device.

FIG. 3 illustrates front views of example electronic devices having various example configurations for thin border displays and borderless displays.

DETAILED DESCRIPTION

Figure 1:
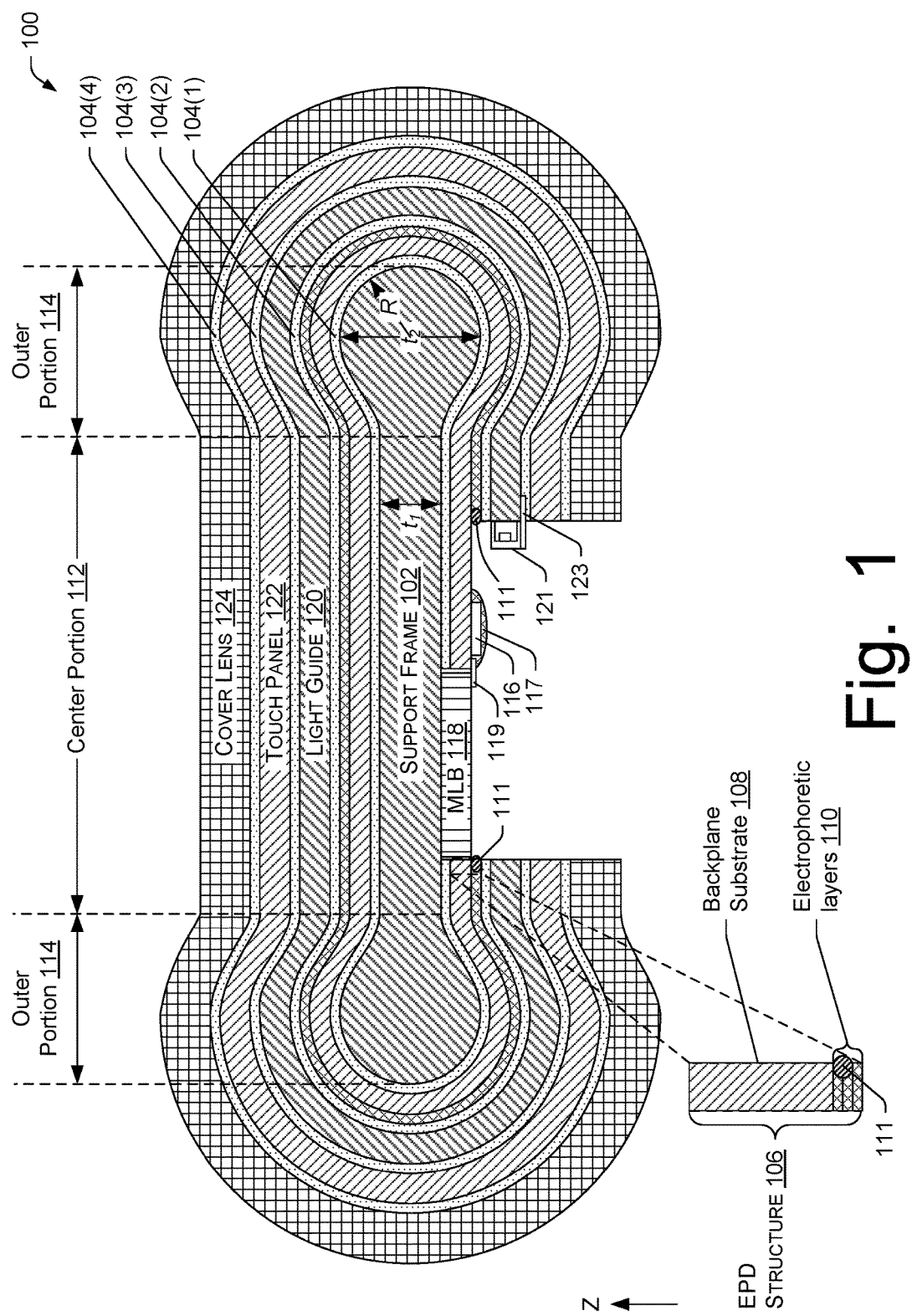
FIG. 1 illustrates a side, cross-sectional view of an example display structure for a borderless electrophoretic display of an electronic device.

Disclosed herein are borderless displays that utilize a support frame having a bulged periphery (or outer portion), and a flexible electrophoretic display (EPD) structure that is curved at least partly around the support frame. The bulged outer portion of the support frame allows the flexible EPD structure to be wrapped around the outer portion of the support frame without damaging elements of the EPD structure in the process. This is because the radius of curvature of the support frame at the bulged, outer portion can be designed at or above a minimum radius of curvature, which prevents the flexible EPD structure from being damaged when it is curved around the support frame. Meanwhile, the center portion of the support frame can be made thinner, as compared to the thickness of the support frame at the bulged, outer portion. In this manner, the overall profile (in the z-direction) of the electronic device can be made as thin as possible without damaging fragile elements in the EPD structure.

The disclosed borderless displays can comprise a display stack that includes a support frame, a flexible EPD structure disposed on the support frame, a light guide disposed on the flexible EPD structure, a touch panel disposed on the light guide, and a cover lens disposed on the touch panel. The display stack can enable a "borderless" look at a periphery of the electronic device by virtue of the aforementioned layers (e.g., the flexible EPD structure, the light guide, the touch panel, and the cover lens) being at least partly curved around a curved surface at an outer portion of the support frame.

In order to minimize the thickness of the electronic device without compromising the integrity of the flexible EPD structure at its curved portion, the support frame can comprise a center portion having a cross section that is relatively thin as compared to a thickness of the cross section at an outer portion of the support frame. In other words, the cross section of the support frame can be of variable thickness, where the cross section at the center portion has a first maximum thickness, and the cross section bulges (or otherwise increases) to a second maximum thickness at the outer portion, the second maximum thickness being greater than the first maximum thickness at the center portion. The cross section of the support frame at the center portion can be generally rectangular in shape with a planar front surface and a planar back surface, while the cross section of the support frame at the outer portion can be generally circular in shape with a curved surface. The flexible EPD structure (as well as the additional layers of the display stack) can be curved around the curved surface at the outer portion to create a display with a borderless look.

The flexible EPD structure, the light guide, the touch panel, and the cover lens can each be of substantially uniform thickness, and can extend from the center portion of the support frame and over the curved, outer portion of the support frame. When the individual layer thicknesses in the display stack are uniform along the length of the layers, the device can exhibit a visible bulge on its exterior surface at the periphery of the electronic device. In some configurations, the display stack can include compensating features that allow for "hiding the bulge in the support frame" so that the electronic device exhibits a substantially planar external surface, without any visible bulge.

Also disclosed herein are "thin border" displays for electronic devices that can achieve ultra-thin borders due to space saving features. As used herein, "thin border" may correspond to a border that is no greater than about 5 millimeters (mm). The borderless, and thin border, displays described herein may improve user experience with electronic devices like electronic book readers (e-book readers) and tablets by making textual content look more like paper, giving the user an experience that is similar to viewing a tangible, hardcopy book, magazine, newspaper, or the like. The borderless and thin border displays may also increase the display area on the electronic device by 10-25%, allowing for more content of the same size (e.g., font size) to fit on a single page, when presented on the display of the electronic device.

The techniques, systems, and devices described herein may be implemented in a number of ways. Example implementations are provided below with reference to the following figures.

FIG. 1 illustrates a side, cross-sectional view of an example display structure 100 (or "display stack" 100) for a borderless electrophoretic display (EPD) of an electronic device. The terms "display structure" and "display stack" may be used interchangeably herein. The display structure 100 may comprise a support frame 102 that is configured to support the remaining layers of the display structure 100 that are disposed on the support frame 102. The support frame 102 may be made of any suitable material, such as acrylonitrile butadiene styrene (ABS) plastic, or another rigid, or semi-rigid, material suitable for electronic device housings, such as metal, carbon fiber, and so on. The support frame 102 can represent what is sometimes referred to as a "mid-frame" of the electronic device. In this sense, the electronic device can include components that are external to the support frame 102, and which are enclosed by a back plate, or a similar cover, enclosure, or external housing configured to protect the components of the electronic device that are situated on the exterior of the support frame 102. The external housing can take any shape, size, or configuration that is suitable for enclosing at least some components that are situated on the exterior of the support frame 102.

A flexible EPD structure 106 can be disposed on, or otherwise attached to, the support frame 102. Attachment of the EPD structure 106 to the support frame 102 can be enabled by any suitable attachment mechanism, such as an adhesive layer 104(1) between the support frame 102 and the EPD structure 106. The adhesive layer 104(1) can comprise an optically clear adhesive (OCA) that is transparent to allow light to pass through the adhesive layer 104(1), and is configured to bond the flexible EPD structure 106 to the support frame 102. For example, an OCA layer used for the adhesive layer 104(1) can comprise a die-cut film adhesive (e.g., "3M Optically Clear Adhesive 8146®," commercially available from 3M Company® of St. Paul, Minn.) that creates an optical bond to improve the contrast ratio of the display. The EPD structure 106 itself can comprise multiple layers, including, without limitation, a flexible backplane substrate 108, and multiple electrophoretic layers 110 disposed on the flexible backplane substrate 108. Adhesive layers may be interspersed between any or all pairs of adjacent layers in the EPD structure 106.

The flexible backplane substrate 108 can be made of any suitable flexible material, such as, without limitation, polyimide (PI), polyamide (PA), polyethylene terephthalate (PET), polyethersulfone (PES), polycarbonate (PC), and the like. In this manner, the backplane substrate 108, being flexible, can be curved around the support frame 102, as shown in FIG. 1.

The electrophoretic layers 110 can include a layer of dielectric solvent (e.g., a high dielectric, low viscosity suspending medium) having charged particles dispersed throughout the dielectric solvent. The charged particles may be of different colors (e.g., a combination of white, black, and/or colored particles). White particles and color particles, or white particles and black particles, may move within the dielectric solvent in response to an electric field applied thereto. For a mono type EPD, which generates black and white images on the display, the dielectric solvent may contain white and black particles. For an EPD configured to generate colored images, the dielectric solvent may contain white and colored particles.

The electrophoretic layers 110 can further include a transparent conductive layer disposed on the layer of dielectric solvent. Such a transparent conductive layer can allow for an electric field to be generated upon driving an electrode of the backplane substrate 108 with a driving voltage. For example, a transparent conductive layer can be patterned into columns or rows for a passive matrix display, or it can comprise a uniform plate conductor without a pattern for an active matrix display. Such a transparent conductive layer can therefore comprise any suitable type of electrode, including, without limitation, indium tin oxide (ITO), carbon nanotubes, silver or copper nanowires, a metal mesh screen, and the like.

The electrophoretic layers 110 can further include a transparent protective substrate disposed on the transparent conductive layer, which protects the layers behind the transparent protective substrate. Moreover, at a point where the electrophoretic layers terminate, an edge seal 111 can be disposed between the backplane substrate 108 and the transparent protective substrate in the electrophoretic layers 110 in order to prevent environmental contaminants (e.g., oxygen and water vapor) from damaging the electrophoretic material in the electrophoretic layers 110. The edge seals 111 at the ends of the EPD structure 106 can be comprised of any suitable resin material (e.g., Phenoxy Resin) that acts as a sealant against environmental contaminants.

The EPD structure 106 can be a passive matrix drive type, an active matrix drive type, or a segmented-electrode direct drive type display. In any case, the backplane substrate 108 is configured to drive the display at a pixel level by providing an electric field to influence the movement of charged particles within the electrophoretic layers 110, which, in turn, causes an image to be formed on the display. That is, if an electrical signal is applied to an electrode on the surface of the backplane substrate 108, an electric field may be generated, which causes charged particles (e.g., white, black, grey, and/or colored particles) to move within the layer of dielectric solvent so that an image can be generated on the display of the electronic device.

In the case of a passive matrix display, the backplane substrate 108 can be patterned with a row electrode and the transparent conductive layer in the electrophoretic layers 110 can comprise a column electrode, or vice versa. In the case of an active matrix display, the backplane substrate 108 can comprise a thin film transistor (TFT) array substrate comprising a pixel electrode(s), and the transparent conductive layer in the electrophoretic layers 110 can comprise a uniform transparent electrode, such as a uniform layer of ITO. In a segmented-electrode display configuration, segmented electrodes may be provided on a substrate, such as the backplane substrate 108, and may each be driven independently with the desired voltage to give the desired optical state in a so-called "direct drive scheme"). In this implementation, the transparent conductive layer in the electrophoretic layers 110 can comprise a uniform transparent electrode. The backplane substrate 108 can also comprise a set of patterned electrodes with each electrode connected to its own driver, such as a segmented display.

In any case, the backplane substrate 108 can comprise various electrodes and electrically conductive traces on the front surface of the flexible backplane substrate 108, which may be susceptible to failure (e.g., cracking) when the flexible EPD structure 106 is flexed, bent, or otherwise curved around the support frame 102. Thus, the support frame 102 can be designed to have a cross-sectional shape, as shown in FIG. 1, which reduces the likelihood that these fragile elements in the EPD structure 106 will fail during manufacture of the display structure 100. In order to aid the description of the cross-sectional shape of the support frame 102, FIG. 1 shows how the support frame 102 can be divided into various portions, including a center portion 112, and multiple outer portions 114 at a periphery of the support frame 102. In general, the support frame 102 can have a cross section of variable thickness. For example, the cross section of the support frame 102 at the center portion 112 can have a first maximum thickness, $t_1$, and the cross section of the support frame 102 at one or more of the outer portions 114 can have a second maximum thickness, $t_2$, that is greater than the first maximum thickness, $t_1$.

Although an electrophoretic display (EPD) structure 106 is shown in the Figures and described herein, it is to be appreciated that the display stack 100 can include different types of display structures that are based on different display technologies, without changing the basic characteristics of the techniques and systems described herein. For example, instead of a flexible EPD structure 106, the display stack 100 can include a flexible OLED display structure. In such a configuration, the flexible display structure 106 can comprise a flexible backplane substrate 108 (e.g., a flexible TFT array substrate 108) and a layer of OLED elements (instead of the electrophoretic layers 110) disposed on the flexible backplane substrate 108. Alternatively, the flexible display structure 106 can comprise a flexible backplane substrate 108 and a layer of liquid crystals (i.e., a liquid crystal display (LCD)). In an LCD configuration, the light guide 120 can be disposed between the support frame 102 and the flexible display structure 106 to act as a backlight unit for flexible display structure 106. Hence, the flexible EPD structure 106 shown in the Figures and described herein and be more generally referred to as a flexible display structure 106, and can comprise display layers suitable for any type of display technology described herein.

Turning briefly to FIGS. 2A-2C, various configurations of the support frame 102 are depicted, each having the aforementioned characteristic of a cross section of variable thickness, where the thickness of the cross section bulges at the outer portion(s) 114 of the support frame 102. FIG. 2A illustrates a side, cross-sectional view of the support frame 102 shown in FIG. 1, as one example configuration of the support frame 102. As shown in FIG. 2A, the cross section of the support frame 102 at the center portion 112 is generally rectangular in shape, and has a substantially uniform thickness, $t_1$. Of course, the support frame 102 at the center portion 112 can have a variable thickness, which is why the thickness, $t_1$, is referred to as a first maximum thickness, $t_1$. The center portion 112 of the support frame 102 also has a front surface 200 that is planar at the center portion 112, and a back surface 202 that is planar at the center portion 112, the back surface 202 being opposite the planar front surface 200. At the transition from the center portion 112 to the outer portion 114, the thickness of the cross section of the support frame 102 starts to bulge (or otherwise increase) until the thickness reaches a second maximum thickness, $t_2$, at the outer portion 114. The increase in cross-sectional thickness from $t_1$ to $t_2$ can be gradual or stepwise. FIG. 2A shows a gradual increase in thickness represented by a smooth, outwardly-curved feature on the front surface of the support frame 102 at the outer portion 114.

The outer portion 114 in FIG. 2A is generally circular in shape. This circular shape creates a curved surface 204 at the outer portion 114 of the support frame 102. In the example of FIG. 2A, the curved surface 204 on the support frame 102 is a "side" surface of the support frame 102. The radius, R, of curvature of the curved surface 204 (shown on the left side of the support frame 102 in FIG. 2A, assuming a symmetrical cross-sectional shape) can be about half of the second maximum thickness, $t_2$, because the thickness, $t_2$, at the outer portion 114 of the support frame 102 corresponds to a diameter of the circular shape at the outer portion 114.

The radius, R, of curvature of the curved surface 204 at the outer portion 114 of the support frame 102 can be selected at a value that is equal to, or above, a threshold radius that corresponds to a radius of curvature below which elements of the flexible backplane substrate 108 are likely to fail (e.g., above a particular probability of failure). In other words, the threshold radius represents a minimum radius of curvature that the flexible backplane substrate 108 can withstand, in most instances, without causing failure of elements (e.g., conductive traces) of the backplane substrate 108. In some configurations, the threshold radius can be within a range of about 7.5 mm to about 12.5 mm. For example, if the threshold radius is 12.5 mm, the radius, R, of curvature of the curved surface 204 at the outer portion 114 of the support frame 102 can be at least about 12.5 mm, at least about 13 mm, at least about 13.5 mm, at least about 14 mm, at least about 14.5 mm, or at least about 15 mm. Designing the radius, R, of curvature of the curved surface 204 above the threshold (e.g., R=15 mm for a minimum threshold radius of curvature=12.5 mm) provides a buffer, or margin of error, which reduces the likelihood of a failure occurring with an element of the flexible backplane substrate 108. However, the extent to which the radius, R, of curvature exceeds the minimum threshold radius of curvature comes at the cost of added thickness. Thus, the selection of the radius, R, of curvature at a particular value comes with a tradeoff between reducing the thickness of the device and reducing the likelihood of failure in the flexible backplane substrate 108 upon bending the flexible backplane substrate 108 around the support frame 102.

Meanwhile, the first maximum thickness, $t_1$, can be selected to be less than the second maximum thickness, $t_2$, (or less than twice the radius, R, of curvature) in order to recover some of the thickness that is added by the enlarged radius, R, of curvature at the bulged portion of the support frame 102. For example, the first maximum thickness, $t_1$, of the support frame's 102 cross section at the center portion 112 can be no greater than about 14 mm, no greater than about 13 mm, no greater than about 12 mm, no greater than about 11 mm, no greater than about 10 mm, no greater than about 9 mm, no greater than about 8 mm, no greater than about 7 mm, no greater than about 6 mm, no greater than about 5 mm, no greater than about 4 mm, no greater than about 3 mm, no greater than about 2 mm, or no greater than about 1 mm.

FIG. 2B illustrates a side, cross-sectional view of another example support frame 102' that can be used for a borderless electrophoretic display of an electronic device. The support frame 102' includes a similar center portion 112 to that of the support frame 102 shown in FIG. 2A, while the outer portions 114 include an asymmetric bulge—asymmetric with respect to an imaginary, horizontal center line of the center portion 112. By contrast, the support frame 102 of FIG. 2A includes a symmetric bulge at the outer portion(s) 114 of the support frame 102.

The support frame 102' of FIG. 2B includes a planar front surface 200 that spans the center portion 112 of the support frame 102' and the outer portions 114 of the support frame 102' (i.e., the front surface 200 is also planar at the outer portions 114. In this manner, the front face (or surface) of the support frame 102' is a substantially flat, planar front surface 200. The center portion 112 of the support frame 102' (like the center portion 112 of the support frame 102) is generally rectangular in shape and has a planar front surface 200 and a planar back surface 202 opposite the planar front surface 200. At the transition from the center portion 112 to the outer portion 114 of the support frame 102', the thickness of the cross section of the support frame 102' starts to bulge (or otherwise increase) on the back face of the support frame 102' until the thickness reaches a second maximum thickness, $t_2$, at the outer portion 114. The increase in cross-sectional thickness from $t_1$ to $t_2$ can be gradual or stepwise. FIG. 2B shows a gradual increase in thickness represented by a smooth, outwardly-curved feature on the back face of the support frame 102' at the outer portion 114. In the example of FIG. 2B, the curved surface 204 spans the side surface and the back surface 202 of the support frame 102' at the outer portion 114. The radius, R, of curvature of the curved surface 204 at the outer portion 114 of the support frame 102' can also be about half of the second maximum thickness, $t_2$. It is to be appreciated that the support frame 102' can be implemented in an orientation where the support frame 102' is turned 180 degrees (°) with respect to the orientation shown in FIG. 2B. In other words, the asymmetric bulge at the outer portion 114 can curve outwardly from the front face (instead of the back face) of the support frame 102', thereby creating a planar back surface 202 of the support frame that spans the center portion 112 and the outer portions 114 of the support frame 102'.

FIG. 2C illustrates a side, cross-sectional view of yet another example support frame 102" that can be used for a borderless electrophoretic display of an electronic device. Again, the support frame 102" includes a similar center portion 112 to that of the support frames 102 and 102' shown in FIGS. 2A and 2B. The outer portions 114 of the support frame 102", however, include a bulge on the front surface of the support frame 102". In other words, the curved surface 204 of the support frame 102" at the outer portion(s) 114 of the support frame 102" can be regarded as a curved "front" surface 204, in contrast to the curved "side" surfaces 204 in FIGS. 2A and 2B.

The support frame 102" of FIG. 2C includes a first planar front surface 200 at the center portion 112, as well as second and third planar front surfaces 206 at the outer portions 114 of the support frame 102". Meanwhile, the planar back surface 202 of the support frame 102" spans the center portion 112 and the outer portions 114 of the support frame 102". In this manner, the back face (or surface) of the support frame 102" is a substantially flat, planar back surface 202.

Like the support frames 102 and 102' of FIGS. 2A and 2B, the center portion 112 of the support frame 102" is generally rectangular in shape. At the transition from the center portion 112 to the outer portion 114 of the support frame 102", the thickness of the cross section of the support frame 102" starts to bulge (or otherwise increase) on the front face of the support frame 102" until the thickness reaches a second maximum thickness, $t_2$, at the outer portion 114. The increase in cross-sectional thickness from $t_1$ to $t_2$ can be gradual or stepwise. FIG. 2C shows a gradual increase in thickness represented by a smooth, outwardly-curved feature on the front face of the support frame 102" at the outer portion 114. The radius, R, of curvature of the curved surface 204 at the outer portion 114 of the support frame 102' can be greater than half of the second maximum thickness, $t_2$, in the configuration of FIG. 2C.

Returning to FIG. 1, which illustrates the display structure 100 as implementing the support frame 102 of FIG. 2A, the flexible EPD structure 106 is shown as being curved, or wrapped, around the curved side surfaces 204 of the support frame 102 at the outer portions 114 of the support frame 102. Accordingly, the flexible EPD structure 106 is considered to be disposed on the support frame 102 at the center portion 112 of the support frame 102, as well as the outer portions 114 of the support frame 102 by extending from the planar front surface 200 of the support frame 102 at the center portion 112 to the planar back surface 202 at the center portion 112, and wrapping around the curve side surfaces 204 of the support frame 102 at the outer portions 114.

In the example of FIG. 1, the flexible EPD structure 106 makes a turn of about 180° around the curved side surfaces 204 of the support frame 102 where the EPD structure 106 terminates in a substantially horizontal orientation on the planar back surface 202 of the support frame 102. In this configuration, the flexible EPD structure 106 can terminate at any point on the back surface 202 at the center portion 112, such as at the middle of the center portion 112, or at an end of the center portion 112 next to the dividing line between the outer portion 114 and the center portion 112 of the support frame 102. The point at which the flexible EPD structure 106 terminates on the back surface 202 may depend on providing a sufficient amount of surface area to bond the EPD structure 106 to the support frame 102 without causing peeling or other adverse effects on the bond due to the curvature of the support frames 102 surface at the outer portions 114. However, it is to be appreciated that the EPD structure 106 can be curved around the support frame 102 to a smaller degree, such as by making a turn that is less or equal to about 90°, or by making a turn that is between 90° and 180°.

FIG. 1 also shows that one or more driver chips 116 (or driving integrated circuits (ICs) 116) can be mounted directly on a front surface of the flexible backplane substrate 108, and electrically coupled to the backplane substrate 108. For example, the driver chip(s) 116 can be electrically coupled to the pixel electrode and/or drive circuits of a TFT-type backplane substrate 108 in order to provide the drive signals to the pixel electrode and/or drive circuits, which generates the electric field for influencing the electrophoretic particles in the display to form an image thereon. It is to be appreciated that the driver chip(s) 116 is oriented in the negative z-direction, on a horizontal plane behind the support frame 102. In general, the components and layers of the display structure 100, and of other structures shown in the following figures, may be considered to have front and back surfaces that are oriented in the "z-direction" of a three-dimensional Cartesian coordinate system (e.g., denoted by x, y, z). FIG. 1 shows how the support frame 102 and the multiple additional layers of the display structure 100 are stacked in the z-direction such that each of the components and layers may be considered to have a front surface oriented in the positive z-direction (i.e., closer to a viewing user), and a back surface oriented in the negative z-direction (i.e., farther from a viewing user). It is to be appreciated that the various components and layers described herein may include surfaces that can be referenced in a similar manner. In this manner, the driver chip(s) 116 is still considered to be mounted on the front surface of the flexible backplane substrate 108, despite being oriented in the negative z-direction, due to the fact that the backplane substrate 108 is wrapped around the support frame 102, and therefore, the surfaces of the backplane substrate are in a reversed (or "upside-down") orientation on the back surface of the support frame 102.

FIG. 1 also shows an encapsulation layer 117 that is disposed on the driver chip(s) 116. In some configurations, the encapsulation layer 117 comprises an insulating material that is deposited atop the driver chip(s) 117 during a manufacturing process. Any suitable insulating material may be used for the encapsulation layer 117, including, without limitation, silicon dioxide, silicon nitride, or any other insulating material that ensures that electrical components are not shorted during operation of the electronic device.

FIG. 1 also shows a main logic board (MLB) 118 disposed behind the support frame 102, which can have a variety of electrical components mounted thereon for providing various functions for the electronic device. For example, the MLB 118 can have mounted thereon a controller driver IC, one or more central processing units (CPUs), one or more graphics processing units (GPUs), and other suitable components generally found on main logic boards of electronic devices. A flex circuit 119 is shown in FIG. 1 as electrically coupling the backplane substrate 108 to the MLB 118.

FIG. 1 further illustrates a light guide 120, a touch panel 122 (or "touch sensor" 122), and a cover lens 124. The light guide 120 can be disposed on the flexible EPD structure 106, and particularly, on the front surface of the transparent protective substrate in the electrophoretic layers 110. Attachment of the light guide 120 to the EPD structure 106 can be enabled by any suitable attachment mechanism, such as an adhesive layer 104(2) between the EPD structure 106 and the light guide 120. The adhesive layer 104(2) can comprise an OCA that is transparent and configured to bond the light guide 120 to the EPD structure 106. The light guide 120 can be made of a flexible silicon material (e.g., silicon elastomer) so that the light guide 120 can be curved around the support frame 102, similar to how the flexible EPD structure 106 is curved around the support frame 102. The light guide 120 is configured to guide light around the electrophoretic material of the EPD structure 106. The light guide 120 is shown as having a uniform thickness in FIG. 1 and is shown as spanning the center portion 112 of the support frame 102, as well as the outer portions 114 of the support frame 102 by being curved around the curved surfaces 204 of the support frame 102 at the outer portions 114, and terminating on the back surface 202 of the support frame 102 at the center portion 112. A light source 121, such as an array of light emitting diodes (LEDs), can be provided proximate to the light guide 120. For example, a flex circuit 123 (or flexible printed circuit (FPC) 123) can couple the light source 121 to the light guide 120 such that the light source 121 is positioned proximate to the light guide 120 where the light guide 120 terminates behind/underneath the support frame 102. Such light sources 121 are configured to generate the light that is ultimately guided by the light guide 120. In the configuration shown in FIG. 1, the light source 121 and the light guide 120 can represent an edge-light type front-light unit.

It is to be appreciated that the light guide 120 and the light source 121 are purely optional in the display stack 100. For example, the display stack 100 can omit the light guide 120 and the light source 121 in configurations where the display stack 100 is a "reflective" display; a display that does not require a backlight or front-light. In this configuration, ambient light from the environment can be reflected from the surface of the display and back to the eyes of the viewing user. As another example, the display stack 100 can omit the light guide 120 and the light source 121 in configurations where the display stack 100 comprises a display layer that emits light itself, such as an organic light-emitting diode (OLED) layer (a layer of OLED elements) that emits light in lieu of the light source 121 and light guide 120 combination.

The touch panel 122 can be disposed on the light guide 120. Attachment of touch panel 122 to the light guide 120 can be enabled by any suitable attachment mechanism, such as an adhesive layer 104(3) between the light guide 120 and the touch panel 122. The adhesive layer 104(3) can comprise an OCA that is transparent and configured to bond the touch panel 122 to the light guide 120. The touch panel 122 can also be made of a flexible material, such as PET, or a similar transparent, flexible plastic. In this manner, the touch panel 122 can be curved around the support frame 102 along with the light guide 120 and the flexible EPD structure 106. The touch panel 122 can be configured to detect touch events on a front surface of the display of the electronic device during operation of the electronic device, such as by detecting a change in capacitance due to the presence of a finger or similar object on the front surface of the display. The touch panel 122 is shown as having a uniform thickness in FIG. 1 and is shown as spanning the center portion 112 of the support frame 102, as well as the outer portions 114 of the support frame 102 by being curved around the curved surfaces 204 of the support frame 102 at the outer portions 114, and terminating at the back surface 202 of the support frame 102 at the center portion 112. It is to be appreciated that the touch panel 122 is purely optional in the display stack 100. For example, the display stack 100 can omit the touch panel 122 in configurations where the display stack 100 is used in an electronic device that does not have a touch screen. In this configuration, the display can be used as an output device, but not as an input device.

The cover lens 124 can disposed on the touch panel 122. Attachment of cover lens 124 to the touch panel 122 can be enabled by any suitable attachment mechanism, such as an adhesive layer 104(4) between the touch panel 122 and the cover lens 124. The adhesive layer 104(4) can comprise an OCA that is transparent and configured to bond the cover lens 124 to the touch panel 122. In configurations where the touch panel 122 is omitted, as described herein, the cover lens 124 can be attached directly to the light guide 120. Alternatively, in configurations where both the touch panel 122 and the light guide 120 are omitted, as described herein, the cover lens 124 can be attached directly to the EPD structure 106. The cover lens 124 can enclose and protect the EPD structure 106, as well as the light guide 120, and the touch panel 122, when included in the display stack 100, from damage during use of the electronic device, and/or from environmental contaminants in general. The cover lens 124 can be made of glass or a hard plastic, such as PC, poly(methyl methacrylate), or a combination thereof, which is configured to protect the more fragile inner display components of the electronic device. The cover lens 124 can be formed in a pre-molded configuration in a separate manufacturing process so that it is already curved upon assembling the display structure 100. The cover lens 124 is shown as having a uniform thickness in FIG. 1 and is shown as spanning the center portion 112 of the support frame 102, as well as the outer portions 114 of the support frame 102 by being curved around the curved surfaces 204 of the support frame 102 at the outer portions 114, and terminating on the back surface 202 of the support frame 102 at the center portion 112.

The various layers 120-124 of the display structure 100 can be curved around the support frame 102 to any suitable degree while still providing a borderless look. For example, individual ones of the layers 120-124 can make a turn of about 180° around the curved side surfaces 204 of the support frame 102, as shown in FIG. 1, where the individual layer terminates in a substantially horizontal orientation on the planar back surface 202 of the support frame 102. Like the flexible EPD structure 106, each layer, in this configuration, can terminate at any point on the back surface 202 at the center portion 112, such as at the middle of the center portion 112, or at an end of the center portion 112 next to the dividing line between the outer portion 114 and the center portion 112 of the support frame 102. However, it is to be appreciated that the individual layers 120-124 can be curved around the support frame 102 to a smaller degree, such as by making a turn that is less or equal to about 90°, or by making a turn that is between 90° and 180°.

In some configurations, the support frame 102 can exclusively comprise the center portion 112 of the support frame 102. In other words, the support frame 102 can be generally rectangular in shape and can terminate at the dividing line between the center portion 112 and the outer portions 114 shown in FIG. 1. In this configuration, the flexible EPD structure 106 can still "bulge" in the manner shown in FIG. 1 by affixing the EPD structure 106 to the support frame 102 at particular locations that allow the EPD structure 106 to bulge around the sides of the support frame 102. For example, instead of wrapping the EPD structure 106 "tightly" around an outer edge of a generally rectangular shaped support frame 102, a portion of the EPD structure 106 can be left unattached, taking a wider turn around the side of the support frame 102 such that the EPD structure 106 is forced to bulge into a circular shape around the support frame 102. The space between the side of the support frame 102 and the EPD structure 106 can be left as an empty chamber, thereby allowing the EPD structure 106 to flex and bend as mechanical stress is applied to the EPD structure 106, which can minimize the stress on the EPD structure 106 at particular locations. Alternatively, the space between the side of the support frame 102 and the EPD structure 106 can be filled with any suitable material, such as silicon, or another type of semi-rigid material that may flex more, as compared to the material chosen for the support frame 102 (e.g., metal). Using a more flexible material in the space between the side of a rectangular shaped support frame 102 and the EPD structure 106 can allow for stress relief on the EPD structure 106 as forces act on the EPD structure 106 during use of the electronic device and/or during manufacturing of the display stack 100.

Due to the uniform thickness of the layers 106 and 120-124 in the display structure 100, and due to the shape of the support frame 102, the exterior surface of the display structure 100 exhibits a visible bulge at the periphery of the display structure 100, as shown in FIG. 1. The following figures describe embodiments where the display stack 100 can include compensating features that allow for the display structure and the electronic device to exhibit a substantially planar external surface, without any visible bulge on the external surface.

Moreover, although FIGS. 1 and 2A show symmetrical support frames 102 that allow for making multiple side edges of the display structure 100 borderless (e.g., two, three, or four borderless side edges), it is to be appreciated that the support frame 102 can include a single bulge on a single outer portion 114 of the support frame 102 so that a single side edge of the display structure 100 is borderless, while the remaining sides edges of the display structure 100 are not borderless (i.e., contain a border or bezel). Any number of sides, from one side to four sides, can be made to have a borderless look by including the bulge at the outer portion 114 at the corresponding edge of the support frame 102, and curving the remaining layers of the display structure 100 around the bulged outer portion(s) 114 of the support frame 102.

FIG. 3 illustrates front views of example electronic devices (i.e., showing the front face of the electronic devices oriented in the X-Y plane) having various example configurations for thin border displays, as well as borderless displays. An example electronic device 300A includes a thin border display of size, d, measured along the diagonal. Notably, the display of the electronic device 300A has a border around all four sides of the display, but the border is made thinner than typical borders/bezels due to the techniques and systems described in the following figures that pertain to thin border displays. Example electronic devices 300B, 300C, 300D, 300E, and 300F illustrate various example configurations of a "borderless" display. In general, the electronic devices 300A-F (collectively 300) may be any electronic device that provides a display, including, without limitation, a tablet computer, e-book reader, a smart watch or similar wearable computer with a display, a smart phone, a laptop or notebook computer, a desktop computer display, a television display, a wall mounted display, a panel display, an automobile display, a navigation device display (e.g., global positioning system (GPS) device display), a point of sale terminal display, an electronic sign, an automated teller machine (ATM) display, or any similar consumer or industrial electronic display device.

Electronic device 300B is an example of an electronic device having a one sided borderless display configuration.

The borderless display shown by the example device 300B may be accomplished by having a portion of a display structure, such as the display structure 100, curved around a support frame, such as the support frame 102, along a single side of the support frame 102. Electronic device 300C is an example of an electronic device having a two sided borderless display configuration, the borderless sides being disposed at opposing sides of the electronic device 300C. Electronic device 300D is an example of an electronic device having a two sided borderless display configuration, the borderless sides being disposed at adjacent sides of the electronic device 300D. Electronic device 300E is an example of an electronic device having a three sided borderless display configuration. Lastly, electronic device 300F is an example of an electronic device having a four sided borderless display configuration. The display structure 100 shown in FIG. 1 can be implemented in any one of the electronic devices 300C, 300E, or 300F, which have at least two opposing borderless sides of the display. However, as noted above, the support frame 102 shown in FIG. 1 can be modified to include a single bulged outer portion (or two adjacent bulged outer portions), which can be implemented in the electronic devices 300B or 300D.

Figure 4:
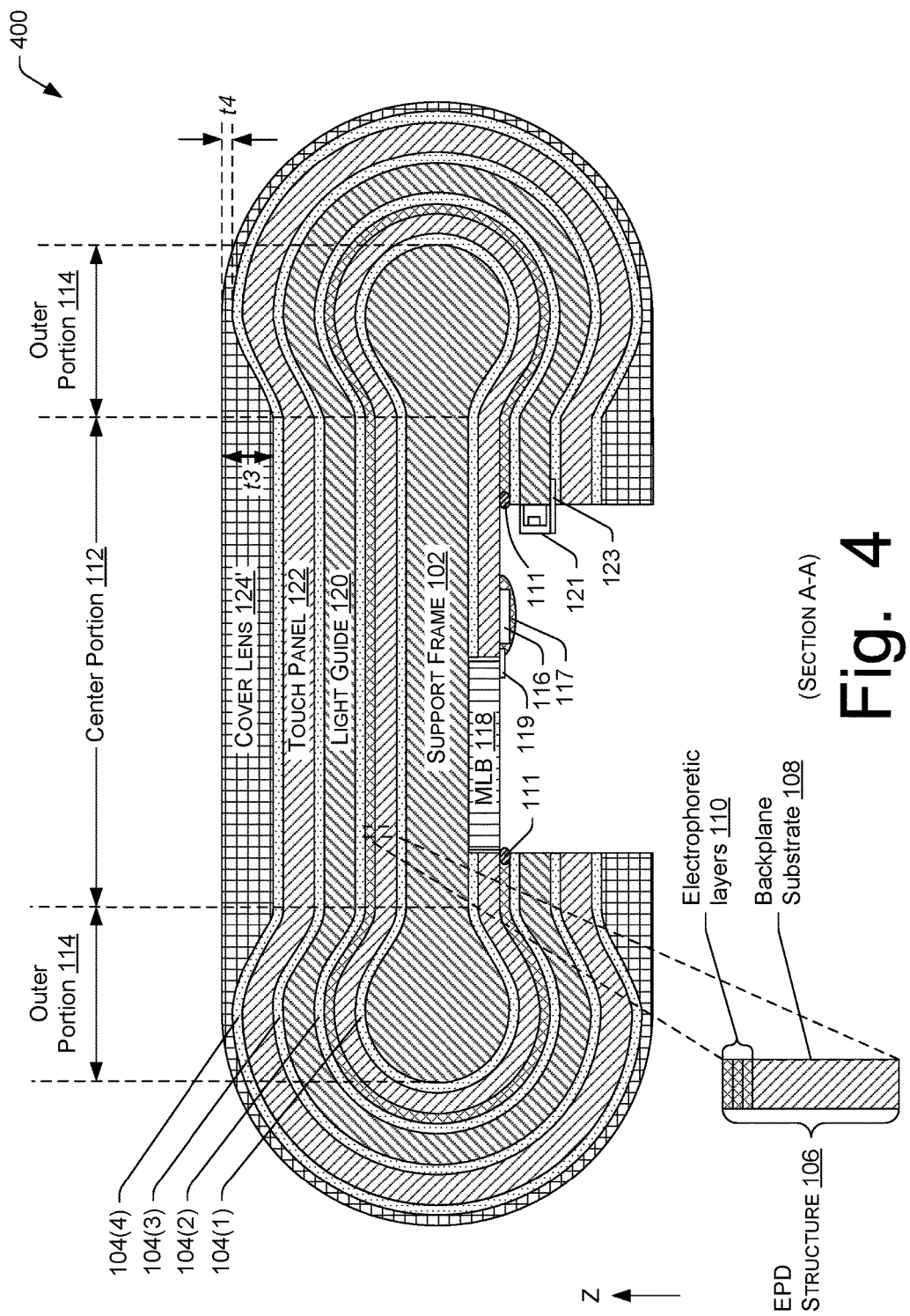
FIG. 4 illustrates a side, cross-sectional view of an example display structure of an electronic device of FIG. 3 along section A-A according to one embodiment.

FIG. 4 illustrates a side, cross-sectional view of an example display structure 400 of an electronic device 300 of FIG. 3 along section A-A according to one embodiment. Although section A-A is shown in FIG. 3 with reference to the electronic device 300C, which has a two sided borderless display, the borderless sides comprising opposing side edges of the electronic device 300C, it is to be appreciated that the example display structure 400 of FIG. 4 can be implemented in any borderless display device with opposing borderless sides, such as the electronic device 300C, 300E, or 300F. Furthermore, the display structure 400 can be modified to a single sided borderless display device (300B), or a two sided borderless display device (300B) having adjacent borderless sides, by modifying the symmetric support frame 102 in FIG. 4 to have a single bulge on a single outer portion 114, as opposed to bulges on both outer portions 114.

A difference between the display structure 100 of FIG. 1 and the display structure 400 of FIG. 4 is in the shape of the respective cover lenses 124 and 124'. For example, FIG. 4 shows that the cover lens 124' can have a cross section of variable thickness, in contrast to the cross section of the cover lens 124 shown in FIG. 1, which has a substantially uniform thickness. In the example of FIG. 4, a first portion of the cover lens 124' that is disposed over the center portion 112 of the support frame 102 can have a cross section of maximum thickness, $t_3$. Meanwhile, a second portion of the cover lens 124' that is disposed around the curved side surface 204 of the support frame 102 at the outer portion(s) 114 can have a cross section of maximum thickness, $t_4$, where the maximum thickness, $t_4$, is less than the maximum thickness, $t_3$. In other words, the cover lens 124' can be thicker where it overlies the center portion 112 of the support frame 102, and thinner where the cover lens 124' overlies the curved surface 204 of the support frame 102 at the outer portion 114. The decrease in cross-sectional thickness from $t_3$ to $t_4$ can be gradual or stepwise. FIG. 4 illustrates a gradual decrease in thickness of the cover lens' 124' cross section from $t_3$ to $t_4$. By providing a cover lens 124' having a cross section of reduced thickness around the enlarged bulge of the support frame 102 (at the outer portion 114), at least some of the thickness added by enlarging the support frame 102 at the outer portion 114 can be recovered in order to minimize the thickness of the display structure 400 in the z-direction. Furthermore, the cover lens 124' of variable thickness that is shown in FIG. 4 can allow for an external surface of the display structure 400 that is substantially flat (or planar), as shown in FIG. 4.

The example cover lens 124' in FIG. 4 can be manufactured by starting with a cover lens 124 of uniform thickness, $t_3$, and thinning down a portion of the cover lens 124 in the bend region to a reduced thickness, $t_4$. In an illustrative example, the maximum thickness, $t_3$, at the first portion of the cover lens 124' that overlies the center portion 112 of the support frame 102 can be about 600 microns (or micrometers (μm)), and the maximum thickness, $t_4$, in the second portion of the cover lens 124' that overlies the curved surface 204 of the support frame 102 at the outer portion 114 can be about 200 microns. This equates to a recovery of 400 microns in thickness that can be avoided by thinning the second portion of the cover lens 124' to 200 microns. Although the cover lens 124' is chosen as a layer of the display stack 400 that is suitable for "thinning" around the outer portion 114 of the support frame 102, it is to be appreciated that the same technique can be utilized on other suitable layers of the display stack 400. For example, the light guide 120 can be thinned down at a portion of the light guide 120 that surrounds the curved surface 204 of the support frame 102 at the outer portion(s) 114, so long as the light guiding functionality of the light guide 120 is not inhibited by the reduction in thickness around the bulged outer portion 114 of the support frame 114. In some configurations, the light guide 120 can be made of two different materials to compensate for any effects stemming from a variable thickness cross section of the light guide 120 (e.g., two materials having different indices of refraction).

Various ways of manufacturing the cover lens 124' are contemplated herein. For example, the cover lens 124' can be injection molded into a layer having different thicknesses at different portions along the cross section, as shown in FIG. 4. As another example, a subtractive manufacturing process, such as etching, laser ablation (removal by irradiating the cover lens 124' material with a laser beam), or the like, can be utilized to make a portion of the cover lens 124' in the bend region thinner than the remainder of the cover lens 124'. Alternatively, an additive manufacturing process, such as three-dimensional (3D) printing, can be utilized to make the cover lens 124' with a variable thickness cross section as shown in FIG. 4. Alternatively, an extrusion process can be controlled by changing the rate of extrusion to achieve a desired thickness of the cover lens 214' at respective portions thereof. For example, an extrusion process may start at a first rate of extrusion for a first time interval, then change to a second, higher rate of extrusion for a second time interval, and then change to a third rate of extrusion for a third time interval, which can be the same, or a similar, rate of extrusion as the first rate of extrusion.

Figure 5:
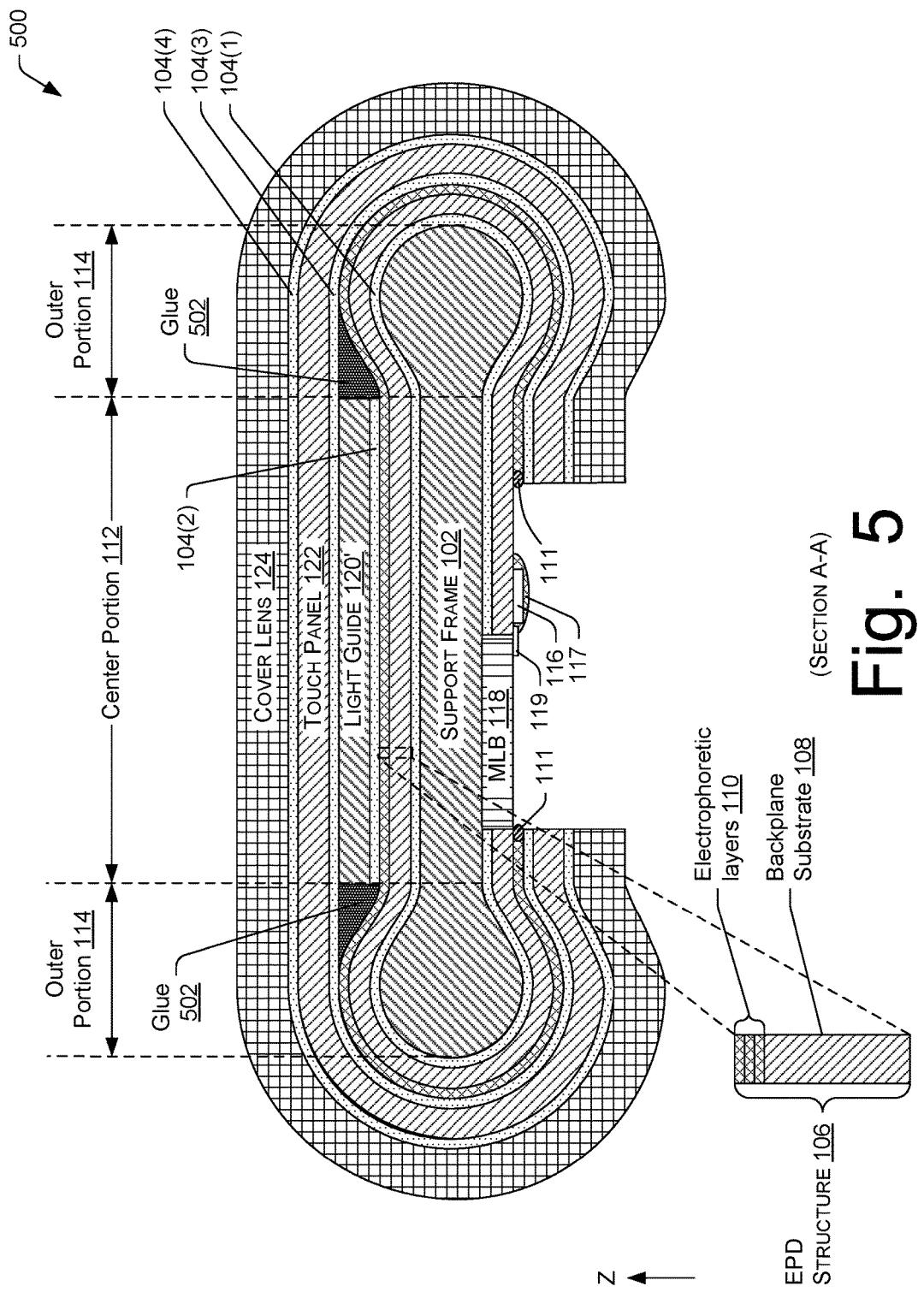
FIG. 5 illustrates a side, cross-sectional view of an example display structure of an electronic device of FIG. 3 along section A-A according to another embodiment.

FIG. 5 illustrates a side, cross-sectional view of an example display structure 500 of an electronic device 300 of FIG. 3 along section A-A according to another embodiment. It is to be appreciated that the example display structure 500 of FIG. 5 can be implemented in any borderless display device with opposing borderless sides, such as the electronic device 300C, 300E, or 300F, and that the display structure 500 can be modified to a single sided borderless display device (300B), or a two sided borderless display device (300B) having adjacent borderless sides, by modifying the symmetric support frame 102 in FIG. 5 to have a single bulge on a single outer portion 114, as opposed to bulges on both outer portions 114.

A difference between the display structure 100 of FIG. 1 and the display structure 500 of FIG. 5 is in the respective light guides 120 and 120'. For example, FIG. 5 shows that the light guide 120' is truncated at a point that is close to the dividing line between the center portion 112 and the outer portion 114 of the support frame 102. In other words, the light guide 120' shown in FIG. 5 is disposed over the center portion 112 of the support frame 102, and is not disposed around the curved side surface 204 of the support frame 102 at the outer portion 114 because the light guide 120' spans the center portion 112 and terminates at a point where the center portion 112 transitions to the outer portion 114 on the support frame 102. In contrast, the light guide 120 shown in FIG. 1 extends around the curved side surface 204 of the support frame 102 and terminates at a point on the back surface 202 of the support frame 102. Thus, the light guide 120' can have a generally rectangular shape and a substantially uniform thickness, and a length that is substantially equal to the length of the center portion 112 of the support frame 102. In this manner, the light guide 120' remains substantially in a flat configuration upon being disposed on the EPD structure 106 at the center portion 112 of the support frame 102. Although FIG. 5 shows that the light guide 120' terminates at the dividing line between the center portion 112 and the outer portion 114 of the support frame 102, the light guide 120' can terminate on either side of the dividing line shown in FIG. 5, so long as the light guide 120' covers a substantial portion of the center portion 112 of the support frame 102.

FIG. 5 shows that the right and left ends of the light guide 120' can terminate in straight edges (i.e., a straight cut in the z-direction) such that a generally triangular shaped gap is created between the EPD structure 106 and the touch panel 122. FIG. 5 shows that this gap can be filled with a glue 502. The glue 502 between the EPD structure 106 and the touch panel 122 can be opaque after curing or setting. However, this comes with a loss of display functionality where the glue 502 is applied to the EPD structure 106. Alternatively, the glue 502 can be transparent, using a similar material to an OCA that can be used to bond adjacent layers of the display stack 500. The transparent-form of the glue 502 can be selected to have an index of refraction that is the same as, or similar to, the index of refraction of the light guide 120'. In some configurations, instead of cutting the light guide 120' in the vertical z-direction at the right and left ends of the light guide 120', the ends of the light guide 120' can be cut at an angle so that the ends of the light guide 120' are shaped to fit the gap occupied by the glue 502 in FIG. 5. That is, the thickness of the cross section of the light guide 120' can gradually reduce to nothing where the touch panel 122 comes into contact with the EPD structure 106 over the outer portion 114 of the support frame 102.

By providing a truncated light guide 120' that is disposed over the center portion 112 of the support frame 102 and is not disposed around the curved surface 204 of the support frame 102 at the outer portion 114, at least some of the thickness added by enlarging the support frame 102 at the outer portion 114 can be recovered in order to minimize the thickness of the display structure 500 in the z-direction. Furthermore, the truncated light guide 120' shown in FIG. 5 can allow for an external surface of the display structure 500 that is substantially flat (or planar), as shown in FIG. 5. For example, the light guide 120' can have a cross section that is about 400 microns thick. Thus, truncating the light guide 120' as shown in FIG. 5 equates to a recovery of 400 microns in thickness of the display structure 500.

It is to be appreciated that, in the configuration of FIG. 5, the location of the light sources 121 that emit light into the light guide 120' may change relative to a location of the light sources 121 in the configurations of FIGS. 1 and 4. For example, the light sources 121 (e.g., an array of LEDs), in the configurations shown in FIGS. 1 and 4 are shown as being positioned on the backside of the support frame 102, while the configuration of FIG. 5 may not allow for placement of the light sources 121 on the backside of the support frame 102. Thus, light sources 121 can be coplanar with the light guide 120' at top and/or bottom sides of the display structure 500. That is, the light sources 121 in the configuration of FIG. 5 can be disposed in front of the support frame 102 and just beyond the end of the display stack 500, such as behind a bezel or border of the electronic device 300C at the top and/or bottom ends of the device 300C.

Figure 6:
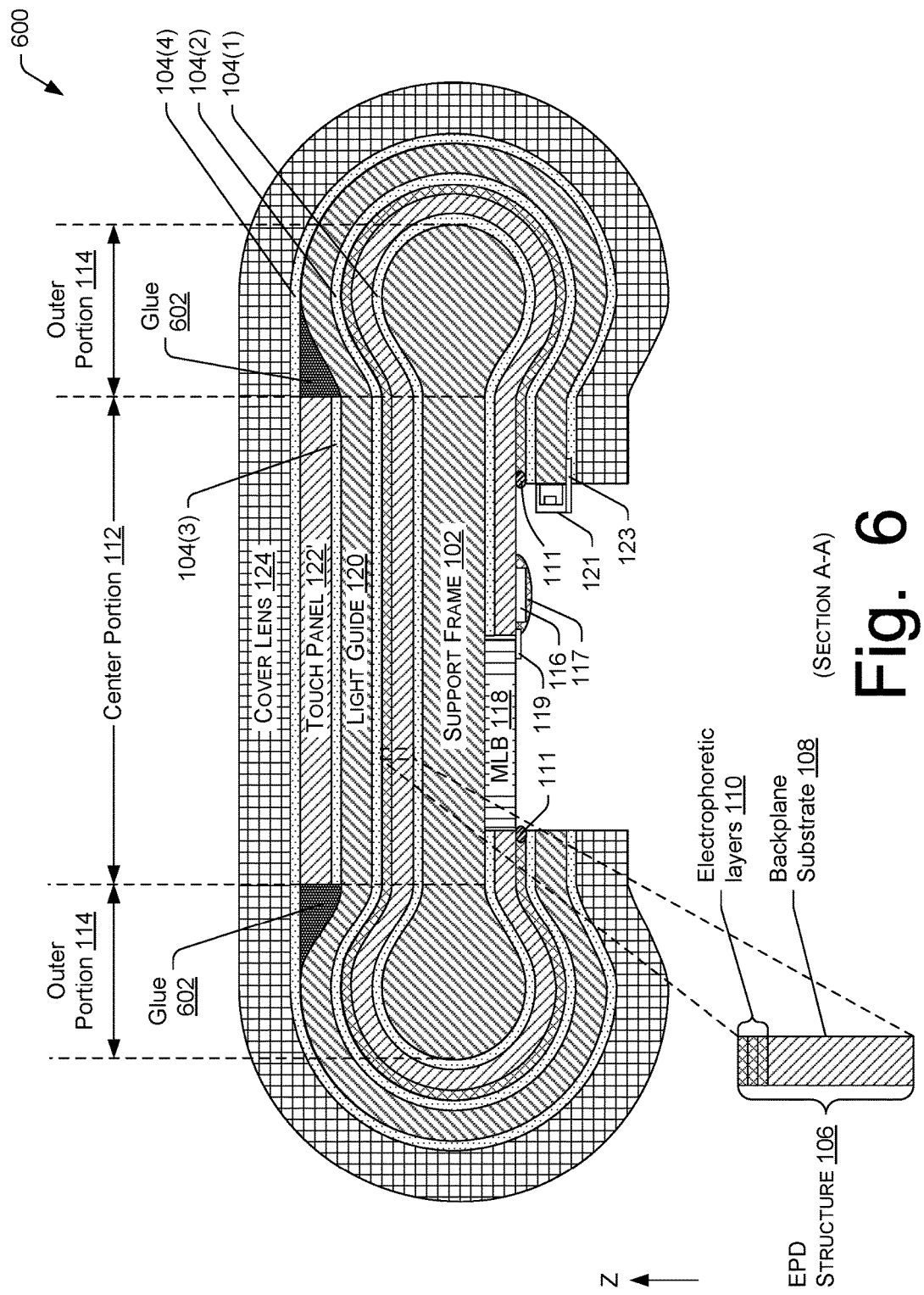
FIG. 6 illustrates a side, cross-sectional view of an example display structure of an electronic device of FIG. 3 along section A-A according to another embodiment.

FIG. 6 illustrates a side, cross-sectional view of an example display structure 600 of an electronic device 300 of FIG. 3 along section A-A according to another embodiment. It is to be appreciated that the example display structure 600 of FIG. 5 can be implemented in any borderless display device with opposing borderless sides, such as the electronic device 300C, 300E, or 300F, and that the display structure 600 can be modified to a single sided borderless display device (300B), or a two sided borderless display device (300B) having adjacent borderless sides, by modifying the symmetric support frame 102 in FIG. 6 to have a single bulge on a single outer portion 114, as opposed to bulges on both outer portions 114.

The configuration of the display structure 600 shown in FIG. 6 is similar to the configuration shown in FIG. 5 except that, instead of truncating the light guide 120, the display structure 600 of FIG. 6 includes a truncated touch panel 122'. For example, FIG. 6 shows that the touch panel 122' is truncated at a point that is close to the dividing line between the center portion 112 and the outer portion 114 of the support frame 102. In other words, the touch panel 122' shown in FIG. 6 is disposed over the center portion 112 of the support frame 102, and is not disposed around the curved side surface 204 of the support frame 102 at the outer portion 114 because the touch panel 122' spans the center portion 112 and terminates at a point where the center portion 112 transitions to the outer portion 114 on the support frame 102. In contrast, the touch panel 122 shown in FIG. 1 extends around the curved side surface 204 of the support frame 102 and terminates at a point on the back surface 202 of the support frame 102. Thus, the touch panel 122' can have a generally rectangular shape and a substantially uniform thickness, and a length that is substantially equal to the length of the center portion 112 of the support frame 102. In this manner, the touch panel 122' remains substantially in a flat configuration upon being disposed on the light guide 120 at the center portion 112 of the support frame 102. Although FIG. 6 shows that the touch panel 122' terminates at the dividing line between the center portion 112 and the outer portion 114 of the support frame 102, the touch panel 122' can terminate on either side of the dividing line shown in FIG. 6, so long as the touch panel 122' covers a substantial portion of the center portion 112 of the support frame 102.

FIG. 6 shows that the right and left ends of the touch panel 122' can terminate in straight edges (i.e., a straight cut in the z-direction) such that a generally triangular shaped gap is created between the light guide 120 and the cover lens 124. FIG. 6 shows that this gap can be filled with a glue 602. The glue 602 between the light guide 120 and the cover lens 124 can be opaque after curing or setting. However, this comes with a loss of display functionality where the glue 602 is applied to the light guide 120. Alternatively, the glue 602 can be transparent, using an OCA or the like. The transparent-form of the glue 602 can be selected to have a particular index of refraction that makes the glue 602 as inconspicuous as possible. In some configurations, instead of cutting the touch panel 122' in the vertical z-direction at the right and left ends of the touch panel 122', the ends of the touch panel 122' can be cut at an angle so that the ends of the touch panel 122' are shaped to fit the gap occupied by the glue 602 in FIG. 6. That is, the thickness of the cross section of the touch panel 122' can gradually reduce to nothing where the light guide 120 comes into contact with the cover lens 124 over the outer portion 114 of the support frame 102.

By providing a truncated touch panel 122' that is disposed over the center portion 112 of the support frame 102 and is not disposed around the curved surface 204 of the support frame 102 at the outer portion 114, at least some of the thickness added by enlarging the support frame 102 at the outer portion 114 can be recovered in order to minimize the thickness of the display structure 600 in the z-direction. Furthermore, the truncated touch panel 122' shown in FIG. 6 can allow for an external surface of the display structure 600 that is substantially flat (or planar), as shown in FIG. 6. For example, the touch panel 122' can have a cross section that is about 400 microns thick. Thus, truncating the touch panel 122' as shown in FIG. 6 equates to a recovery of 400 microns in thickness of the display structure 600. It is to be appreciated that truncating the touch panel 122' as shown in FIG. 6 results in a loss of touch functionality around the sides of the electronic device 300, the tradeoff being a reduction in thickness of the device that the touch panel 122' would otherwise add around the outer portions 114 of the support frame 102.

Although shown separately in FIGS. 5 and 6, it is to be appreciated that an even further reduction in thickness can be achieved by implementing a display structure with both a truncated light guide 120' and a truncated touch panel 122'.

Figure 7:
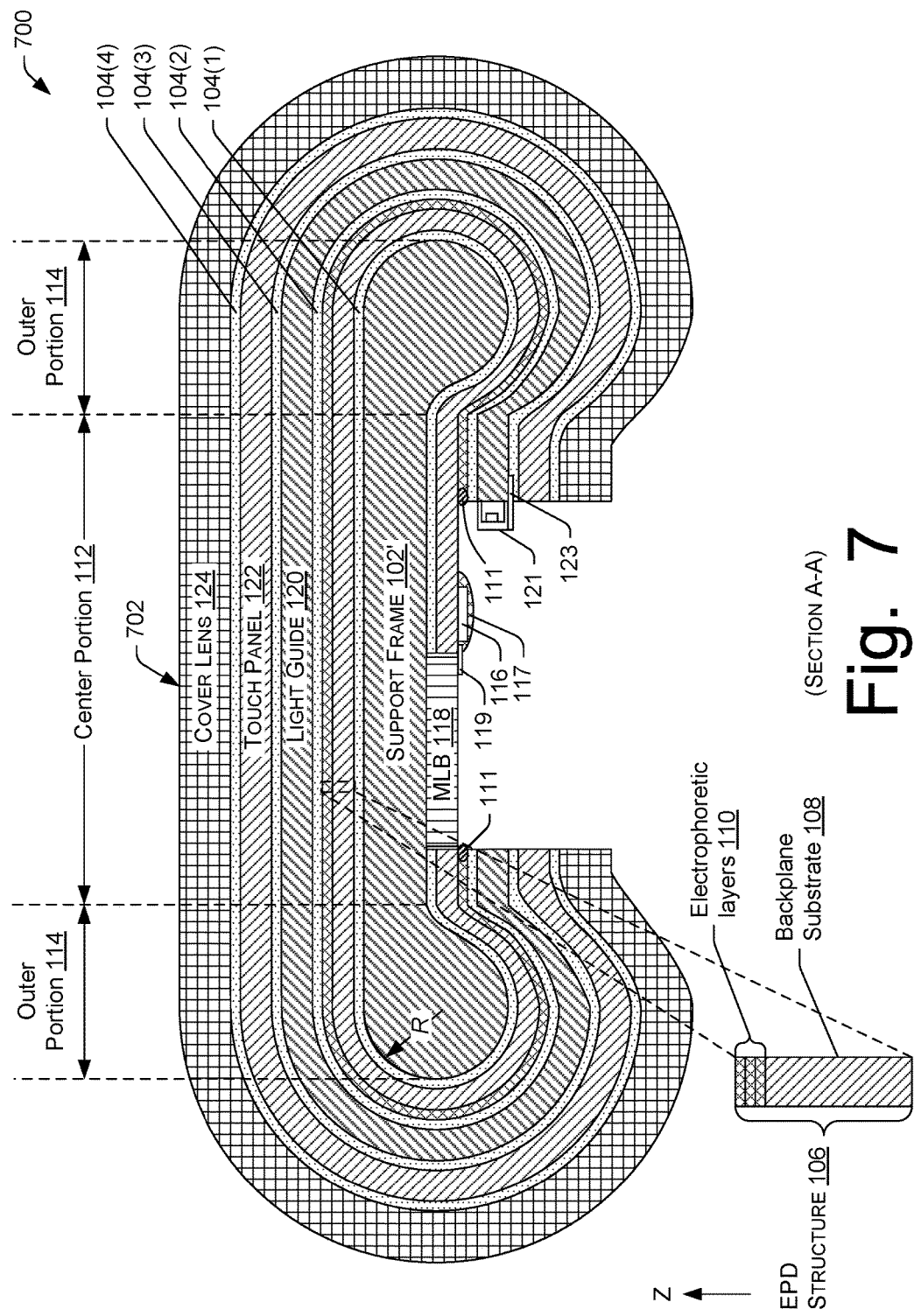
FIG. 7 illustrates a side, cross-sectional view of an example display structure of an electronic device of FIG. 3 along section A-A, the electronic device comprising the support frame of FIG. 2B.

FIG. 7 illustrates a side, cross-sectional view of an example display structure 700 of an electronic device 300 of FIG. 3 along section A-A, the electronic device 300 comprising the support frame 102' of FIG. 2B. As noted above with reference to FIG. 2B, the support frame 102' includes outer portions 114 that include an asymmetric bulge—asymmetric with respect to an imaginary, horizontal center line running through the center portion 112 of the support frame 102'. Because the support frame 102' includes a planar front surface 200 that spans the center portion 112 of the support frame 102' and the outer portions 114 of the support frame 102' (See FIG. 2B), a front external surface 702 of the display structure 700 is substantially flat and planar. Meanwhile, a visible bulge is exhibited on the back face of the display structure 700. It is to be appreciated that the visible bulge exhibited on the back face of the display structure 700 could be mitigated by using the technique shown in FIG. 4 to thin the cover lens 124 behind the bulged outer portions 114 of the support frame 102'.

As noted above, the radius, R, of curvature of the curved surface 204 at the outer portion 114 of the support frame 102' can be selected at a value that is at or above a minimum bend radius that the flexible EPD structure 106 (and particularly the flexible backplane substrate 108) can sustain without elements of the flexible backplane substrate 108 failing during the bending/flexing process that is carried out to wrap the flexible EPD structure 106 around the support frame 102'. However, the center portion 112 of the support frame 102' can be made thinner to recover at least some of the added thickness due to the bulged outer portions 114. It is to be appreciated that orientation of the support frame 102' shown in FIG. 7 can be rotated 180° so that the asymmetric bulge at the outer portion 114 can curve outwardly from the front face (instead of the back face) of the support frame 102'. This configuration would create a back external surface of the display structure 700 that is substantially flat and planar, as opposed to the planar, front external surface 702 shown in FIG. 7.

Figure 8:
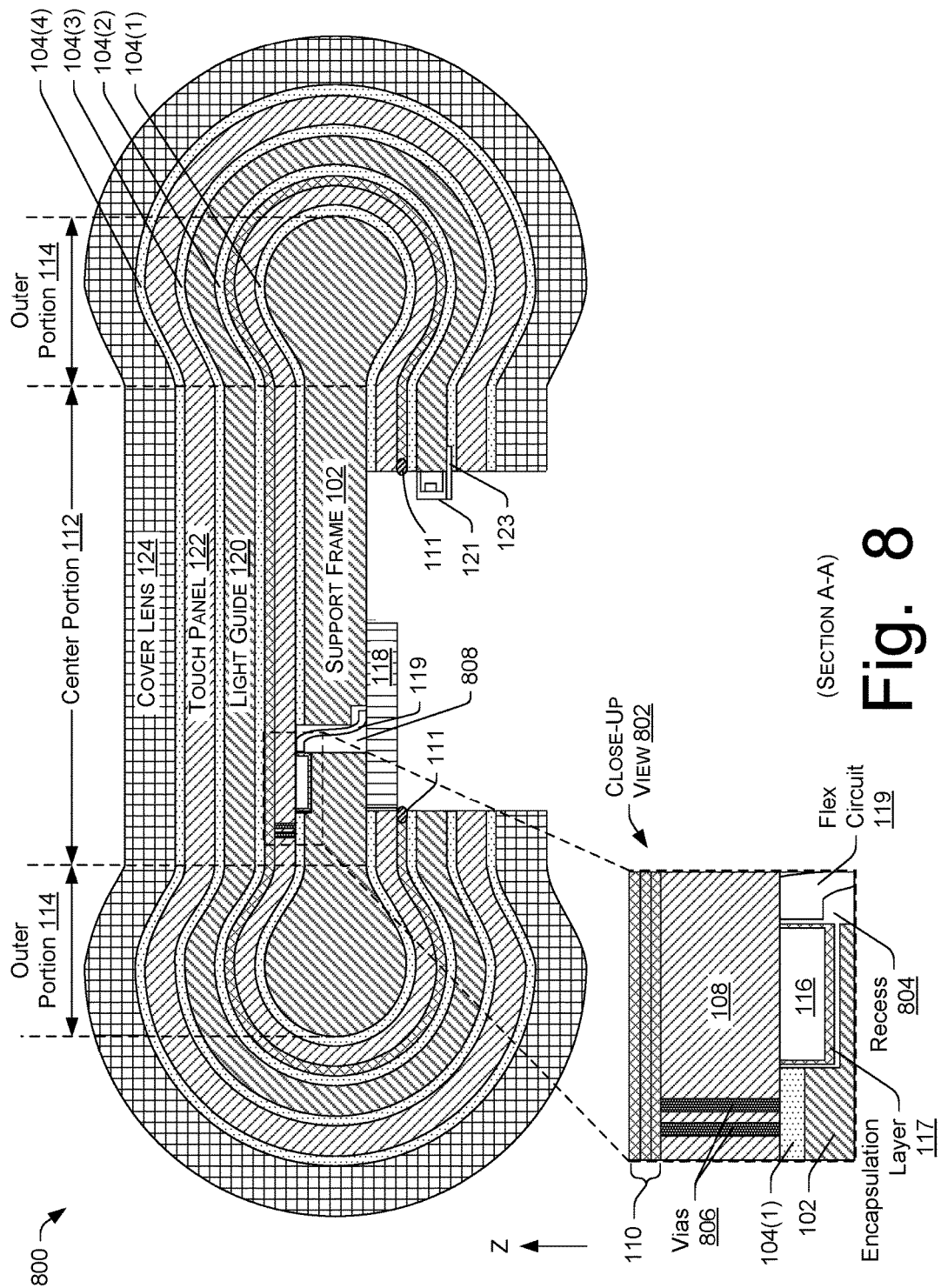
FIG. 8 illustrates a side, cross-sectional view of an example display structure of an electronic device of FIG. 3 along section A-A according to another embodiment.

FIG. 8 illustrates a side, cross-sectional view of an example display structure 800 of an electronic device 300 of FIG. 3 along section A-A according to another embodiment. As shown in the close-up view 802 in FIG. 8, the display structure 800 illustrates a configuration where the driver chip(s) 116 for the backplane substrate 108 is mounted on the back surface of the flexible backplane substrate 108 and seated within a recess 804 defined in the front surface 200 of the support frame 102 at the center portion 112 of the support frame 102. The recess 804 allows the flexible backplane substrate 108 (and the EPD structure 106) to remain planar when disposed on the support frame 102. The placement of the driver chip(s) 116 on the back surface of the flexible backplane substrate 108 is in contrast to the embodiment of FIG. 1, for example, where the driver chip(s) 116 is mounted on the front surface of the flexible backplane substrate 108 and disposed on the back surface 202 of the support frame 102 at the center portion 112 by virtue of the flexible backplane substrate 108 wrapping around the curved side surface 204 of the support frame 102.

In order to electrically couple the driver chip(s) 116 to the electrically conductive traces (e.g., pixel electrode, drive circuits, etc.) on the front surface of the flexible backplane substrate 108, a plurality of vias 806 can be defined in the flexible backplane substrate 108 such that the vias 806 extend through the flexible backplane substrate 108 from the front surface of the backplane substrate 108 to the back surface of the backplane substrate 108. Making vias through traditional display backplane substrates proved difficult in the past due to the fact that traditional backplane substrates are made of glass. However, as noted above, the flexible backplane substrate 108 of FIG. 8 can be made of a flexible material, such as PI or the like. Making vias 806 through a PI (or similar material) backplane substrate 108 is much easier than making the same through a glass backplane, especially when the number of vias 806 are on the order of thousands of vias 806, and each via 806 can be about 10 microns in width, as measured in a direction perpendicular to the z-direction. Furthermore, the backplane substrate 108, being made of a flexible material like PI, can be made much thinner than it could otherwise be made if the backplane substrate were made of glass. For example, the thickness of the flexible backplane substrate 108 can be about 10 microns, in some configurations, which facilitates making high density vias 806 through the backplane substrate 108. Accordingly, the backplane substrate 108 itself behaves much like a flexible printed circuit (FPC) by the use of vias 806 that electrically couple the driver chip(s) 116 to the electrically conductive traces on the front surface of the flexible backplane substrate 108. Although FIG. 8 shows two vias 806 for ease of illustration, it is to be appreciated that any number of vias 806 can be defined in the backplane substrate 108. The support frame 102 in FIG. 8 may further include a conduit 808 that allows a flex circuit 119 to extend through the support frame 102 from the backplane substrate 108 to the MLB 118. The flex circuit 119 is configured to electrically couple the backplane substrate 108 to the MLB 118.

Figure 9:
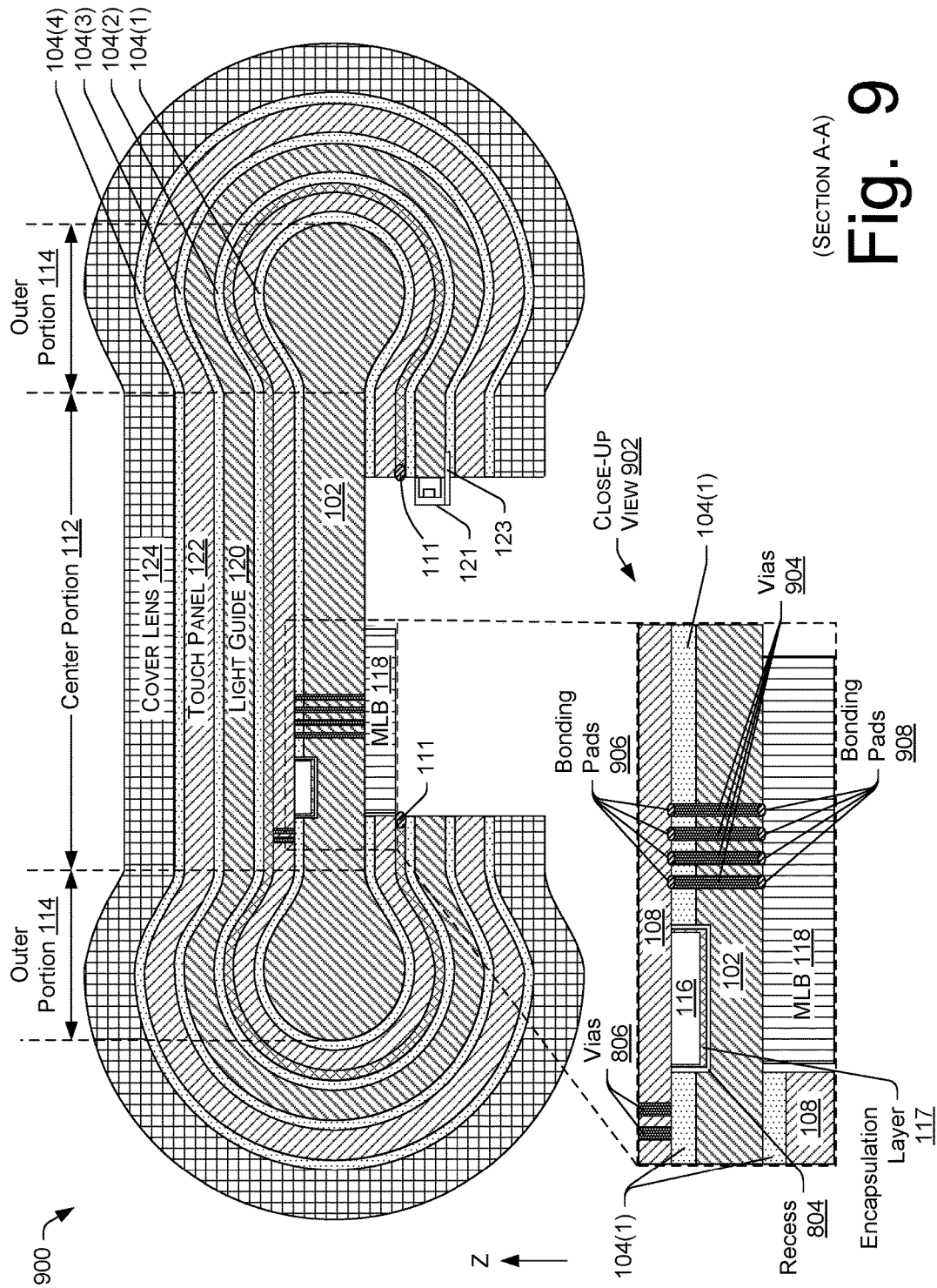
FIG. 9 illustrates a side, cross-sectional view of an example display structure of an electronic device of FIG. 3 along section A-A according to another embodiment.

FIG. 9 illustrates a side, cross-sectional view of an example display structure 900 of an electronic device 300 of FIG. 3 along section A-A according to another embodiment. As shown in the close-up view 902 in FIG. 9, the display structure 900 illustrates a configuration where a plurality of vias 904 are defined in the support frame 102. FIG. 9 shows the vias 904 extending through the center portion 112 of the support frame 102. In some configurations, the vias 904 extend from the back surface 202 of the support frame 102 to the front surface of the adhesive layer 104(1). A plurality of bonding pads 906 can be disposed on the back surface of the flexible backplane substrate 108, and when the backplane substrate 108 is disposed on the support frame 102, the bonding pads 906 are configured to contact the plurality of vias 904 at the front surface of the adhesive layer 104(1). Anisotropic conductive film (ACF) can be used to bond the bonding pads 906 to the plurality of vias 904. An additional set of bonding pads 908 can be disposed on the front surface of the MLB 118 such that the bonding pads 908 are in contact with the other ends of the plurality of vias 904 at the planar back surface 202 of the support frame 102. Again, ACF can be used to bond the bonding pads 908 to the plurality of vias 904 at the planar back surface 202 of the support frame 102. In this manner, the flexible backplane substrate 108 can be electrically coupled to the MLB 118 through the vias 904 in the support frame 102 without requiring a FPC (e.g., the flex circuit 119 shown in FIG. 8) to electrically couple the backplane substrate 108 to the MLB 118. Thus, the vias 904 defined in the support frame 102 allow for eliminating the flex circuit 119 (or any FPC) to connect the backplane substrate 108 to the MLB 118, which reduces manufacturing complexity and/or the bill of materials of the electronic device.

Figure 10:
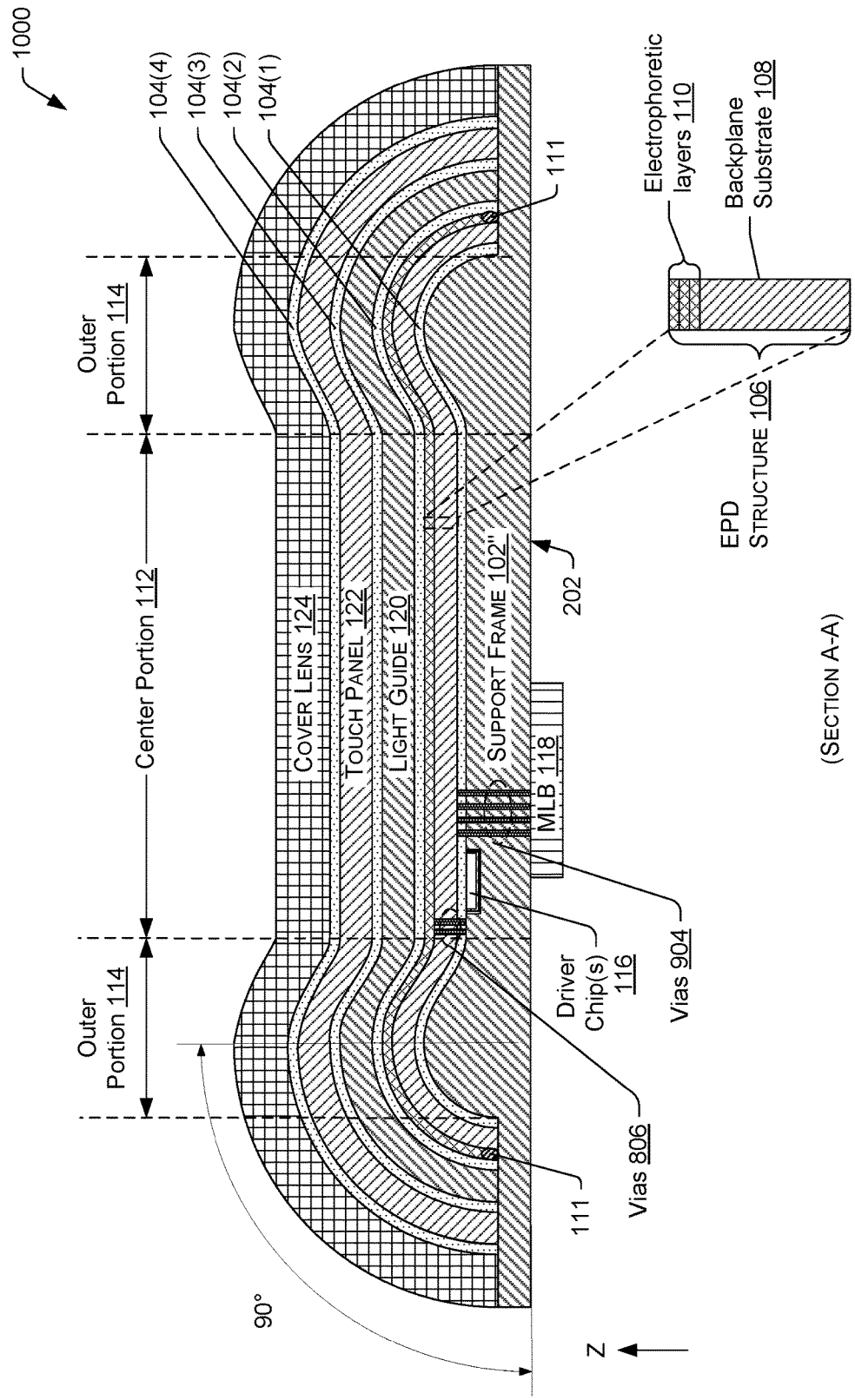
FIG. 10 illustrates a side, cross-sectional view of an example display structure of an electronic device of FIG. 3 along section A-A, the electronic device comprising the support frame of FIG. 2C.

FIG. 10 illustrates a side, cross-sectional view of an example display structure 1000 of an electronic device 300 of FIG. 3 along section A-A, the electronic device comprising the support frame 102" of FIG. 2C. As noted above with reference to FIG. 2C, the front surface of the support frame 102" includes a planar front surface 200 at the center portion 112 of the support frame 102", curved front surfaces 204 at the outer portion 114 of the support frame 102" where the cross section of the support frame 102" bulges to accommodate the appropriate bend radius for the flexible EPD structure 106, and additional planar front surfaces 206 at the outer portions 114 of the support frame 102" where the additional layers of the display structure 1000 terminate. In the configuration of FIG. 10, the back face (or surface) of the support frame 102" is a substantially flat, planar back surface 202. Thus, the flexible EPD structure 106 extends from the planar front surface 200 of the support frame 102" at the center portion 112 of the support frame 102" to the additional planar front surfaces 206 of the support frame 102" at a periphery of the outer portions 114 of the support frame 102" by curving around the curved front surfaces 204 at the outer portions 114 of the support frame 102". The configuration of FIG. 10 shows an example where the layers 106 and 120-124 of the display stack curve around the support frame 102" by making a turn of about 90° and terminating at the additional planar front surfaces 206 at the outer portions 114 of the support frame 102".

FIG. 10 also shows a configuration similar to the embodiment of FIG. 9 in that a plurality of vias 806 defined in the flexible backplane substrate 108 can allow for electrically coupling the driver chip(s) 116 to the electrically conductive traces on the front surface of the flexible backplane substrate 108. Furthermore, an additional set of vias 904 defined in the support frame 102" can allow for electrically coupling the backplane substrate 108 to the MLB 118 without the need for a FPC to do the same.

It is to be appreciated that, in the configuration of FIG. 10, the location of the light sources 121 that emit light into the light guide 120 may be similar to the location of the light sources 121 described with reference to FIG. 5. For example, the configuration of FIG. 10 may not allow for placement of the light sources 121 on the backside of the support frame 102". Thus, light sources 121 can be coplanar with the light guide 120 at top and/or bottom sides of the display structure 1000. That is, the light sources 121 in the configuration of FIG. 10 can be disposed in front of the support frame 102" and just beyond the end of the display stack 1000, such as behind a bezel or border of the electronic device 300 at the top and/or bottom ends of the device 300.

Figure 11:
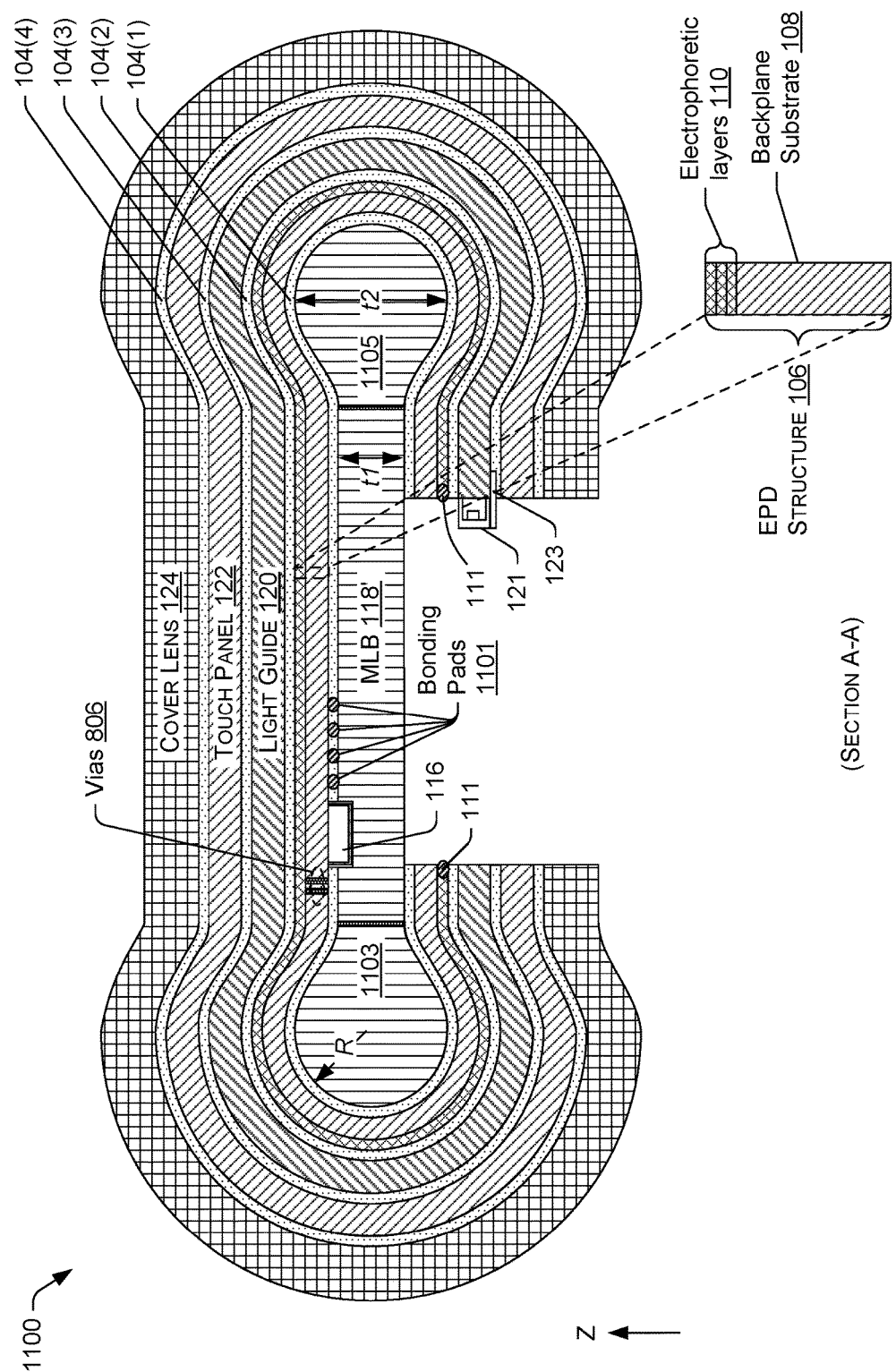
FIG. 11 illustrates a side, cross-sectional view of an example display structure of an electronic device of FIG. 3 along section A-A according to another embodiment.

FIG. 11 illustrates a side, cross-sectional view of an example display structure 1100 of an electronic device 300 of FIG. 3 along section A-A according to another embodiment. In the configuration of FIG. 11, the support frame 102 has been replaced with a main logic board (MLB) 118'. In this manner, the flexible EPD structure 106 can be disposed on the MLB 118' without the need for the support frame 102, or the vias 904 defined in the support frame 102 shown in FIG. 9, for example. In some configurations, bonding pads 1101 similar to the bonding pads 906 or 908 described with reference to FIG. 9 can be used at the interface between the backplane substrate 108 and the MLB 118' in order to electrically couple the backplane substrate 108 to the MLB 118'.

The MLB 118' may have a generally rectangular shape and a cross section of substantially uniform thickness, $t_1$. Furthermore, a first extension 1103 and a second extension 1105 can be coupled to the sides of the MLB 118'. The first extension 1103 and the second extension 1105 can each have a generally circular shape and a cross-sectional thickness, $t_2$, which is greater than the cross-sectional thickness, $t_1$, of the MLB 118'. Thus, the assembly of the MLB 118', the first extension 1103 and the second extension 1105 can share any of the geometric features described with reference to the support frame 102 herein to create a bulging structure that the flexible EPD 106 can be wrapped around. Furthermore, recesses, like the recess 804 for the driver chip(s) 116, can be defined on the surfaces of the MLB 118' to accommodate mounting the various components to the MLB 118', while allowing the flexible EPD structure 106 to be disposed on the MLB 118' in a substantially planar configuration.

Figure 12:
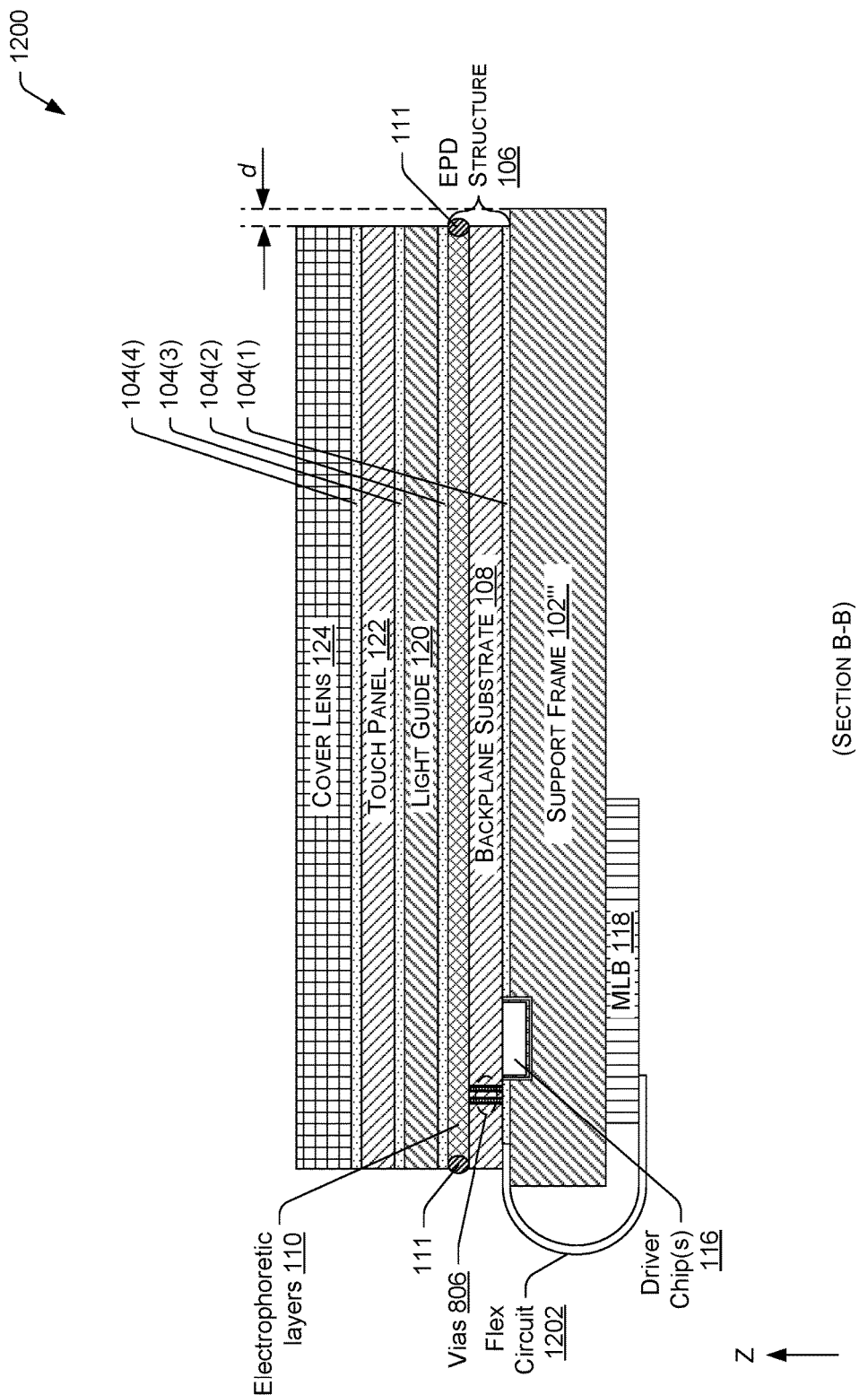
FIG. 12 illustrates a side, cross-sectional view of an example display structure of an electronic device of FIG. 3 along section B-B according to another embodiment.

FIG. 12 illustrates a side, cross-sectional view of an example display structure 1200 of an electronic device 300A of FIG. 3 along section B-B according to another embodiment. The display structure 1200 shown in FIG. 12 is an example of a "thin" border display configuration where, instead of wrapping around the support frame 102''', the EPD structure 106 (and the remaining layers 120-124 of the display structure 1200) extend toward, but stop short of, an outer edge of the support frame 102''' by a distance, d, as shown in FIG. 12. Due to space-saving features, as described herein, the distance, d, at which the ends of the layers 106 and 120-124 are spaced from the edge of the support frame 102''' can be very small, such as a distance, d, that is no greater than about 5 mm. In some configurations, the distance, d, corresponding to the width of the border around the display, can be about 1 mm.

In the borderless configurations described herein, the driver chip(s) 116 can be conveniently mounted on the front surface of the flexible backplane substrate 108 at the end of the backplane substrate 108 so that the driver chip(s) 116 can be wrapped around the support frame 102 and disposed on the back surface 202 of the support frame 102. In the embodiment of FIG. 12, however, the backplane substrate 108 is not wrapped around the support frame 102. Still, the backplane substrate 108, being made of a material, such as, without limitation, PI, PA, PET, PES, PC, and the like, can include vias 806 extending from the front surface to the back surface of the backplane substrate 108. As described with reference to FIG. 8, the vias 806 are configured to electrically couple the driver chip(s) 116 to the electrically conductive traces (e.g., pixel electrode, drive circuits, etc.) on the front surface of the backplane substrate 108. The vias 806 provide advantageous space saving properties in the display structure 1200 because a FPC can be eliminated, which is typically used to connect the backplane substrate 108 to the driver chip(s) 116 when the driver chip(s) 116 is disposed on the back surface of the backplane substrate 108. The configuration of FIG. 12 is also advantageous over mounting the driver chip(s) 116 on the front surface of the backplane substrate 108 because the driver chip(s) 116 have to be positioned outside of the active display area so as to not obscure the images presented on the display, which often means that the driver chip(s) 116 are disposed at a periphery, thereby creating a wide margin or bezel at the periphery of the display. With the driver chip(s) 116 mounted on the back surface of the backplane substrate 108, as shown in FIG. 12, the border, d, can be made thinner as compared to display structures that mount the driver chip(s) 116 on the front surface of the backplane substrate 108.

Furthermore, as noted above with respect to FIG. 8, making vias through traditional display backplane substrates proved difficult in the past due to the fact that traditional backplane substrates are made of glass. However, the backplane substrate 108, being made of a material, such as PI or the like, makes the process of creating the vias 806 through the PI (or similar material) much easier than making the same through a glass backplane. This is especially true when the number of vias 806 are on the order of thousands of vias 806, and each via 806 can be about 10 microns in width, as measured in a direction perpendicular to the z-direction. Furthermore, the backplane substrate 108, being made of a material like PI, can be made much thinner than it could otherwise be made if the backplane substrate were made of glass, which facilitates making high density vias 806 through the backplane substrate 108. Accordingly, the backplane substrate 108 itself behaves much like a FPC by the use of vias 806 that electrically couple the driver chip(s) 116 to the electrically conductive traces on the front surface of the flexible backplane substrate 108. Again, although FIG. 12 shows two vias 806 for ease of illustration, it is to be appreciated that any number of vias 806 can be defined in the backplane substrate 108. In the configuration of FIG. 12, a flex circuit 1202 can electrically couple the backplane substrate 108 to the MLB 118.

Figure 13:
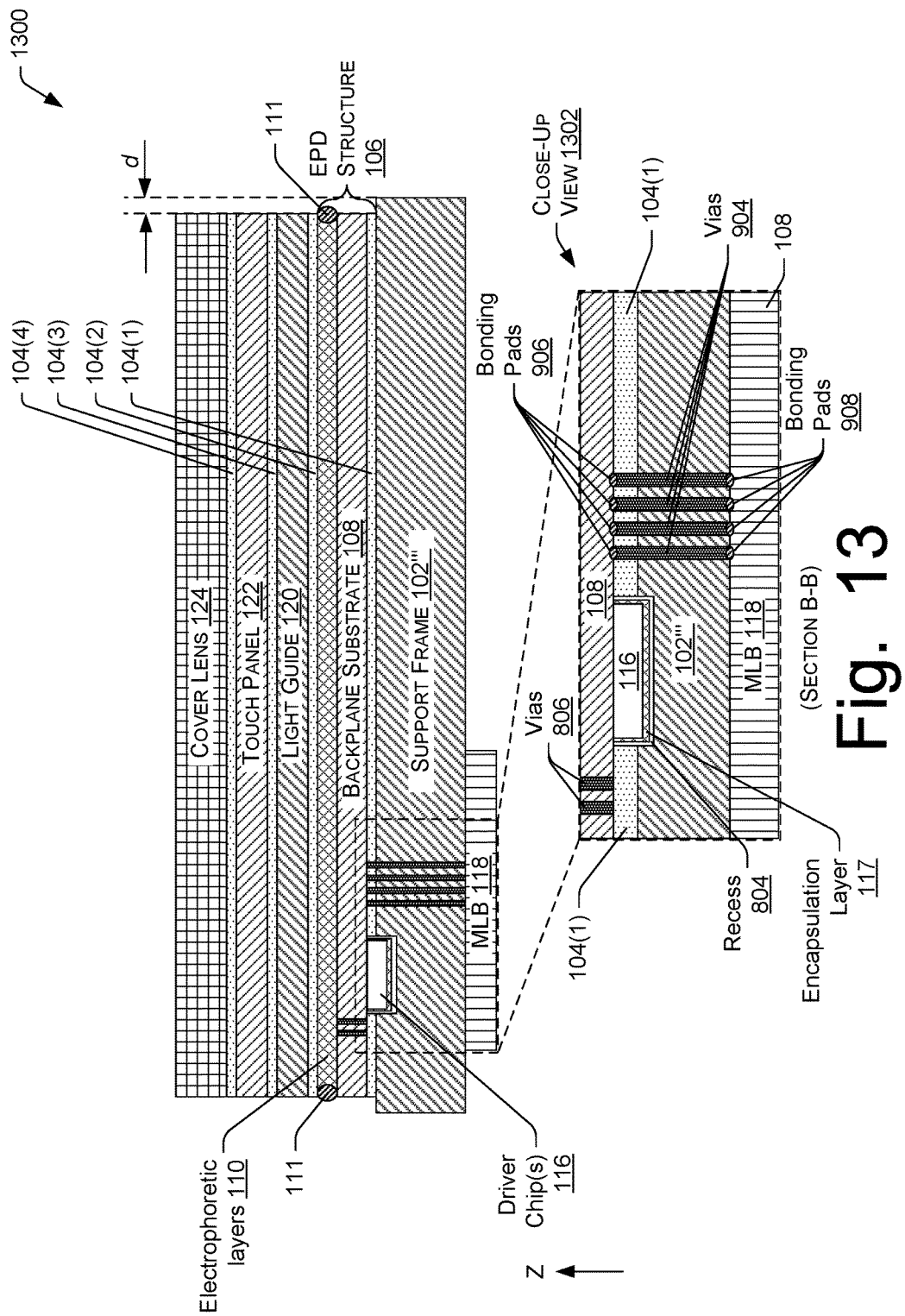
FIG. 13 illustrates a side, cross-sectional view of an example display structure of an electronic device of FIG. 3 along section B-B according to another embodiment.

FIG. 13 illustrates a side, cross-sectional view of an example display structure 1300 of an electronic device 300A of FIG. 3 along section B-B according to another embodiment. Similar to the embodiment of FIG. 9, as shown in the close-up view 1302 in FIG. 13, the display structure 1300 illustrates a configuration where a plurality of vias 904 are defined in the support frame 102'''. The vias 904 can extend through the support frame 102''' from the front surface to the back surface of the support frame 102'''. Furthermore, a plurality of bonding pads 906 can be disposed on the back surface of the backplane substrate 108, and when the backplane substrate 108 is disposed on the support frame 102''', the bonding pads 906 are configured to contact the plurality of vias 904 at the front surface of the support frame 102'''. ACF can be used to bond the bonding pads 906 to the plurality of vias 904 at the front surface of the support frame 102'''. An additional set of bonding pads 908 can be disposed on the front surface of the MLB 118 such that the bonding pads 908 are in contact with the other ends of the plurality of vias 904 at the back surface of the support frame 102'''. Again, ACF can be used to bond the bonding pads 908 to the plurality of vias 904 at the back surface of the support frame 102'''. In this manner, the backplane substrate 108 can be electrically coupled to the MLB 118 through the vias 904 in the support frame 102 without requiring a FPC, such as the flex circuit 1202 shown in FIG. 12, to electrically couple the backplane substrate 108 to the MLB 118. Thus, the vias 904 defined in the support frame 102 allow for eliminating a FPC to connect the backplane substrate 108 to the MLB 118, which reduces manufacturing complexity and/or the bill of materials of the electronic device. Furthermore, the border, d, can be made even smaller by elimination of the FPC, achieving an even thinner border.

Figure 14:
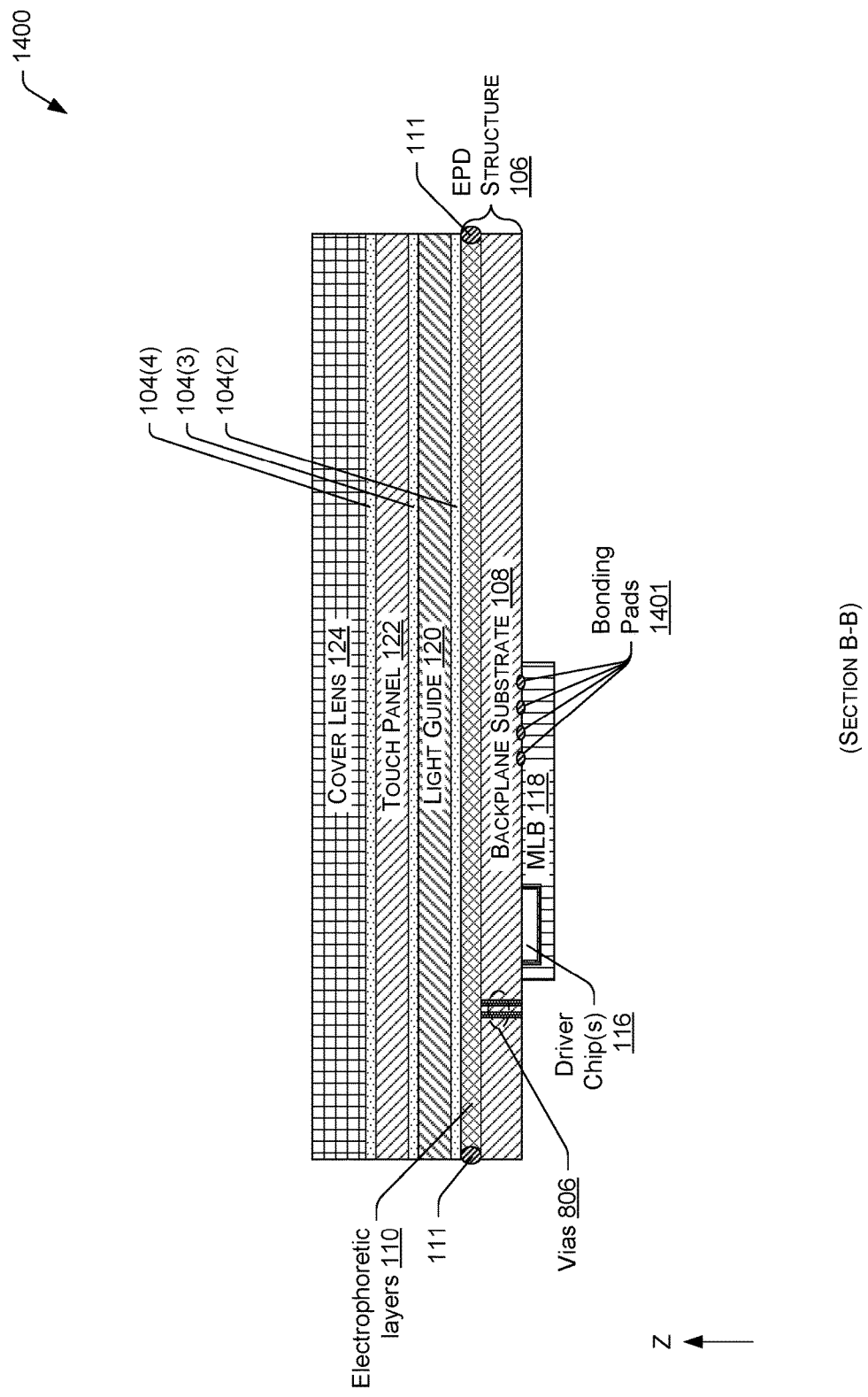
FIG. 14 illustrates a side, cross-sectional view of an example display structure of an electronic device of FIG. 3 along section B-B according to another embodiment.

FIG. 14 illustrates a side, cross-sectional view of an example display structure 1400 of an electronic device 300A of FIG. 3 along section B-B according to another embodiment. In the configuration of FIG. 14, the support frame 102''' of FIGS. 12 and 13 has been eliminated from the display structure 1400, and the EPD structure 106 is disposed directly on the MLB 118, which eliminates the need for the support frame 102''' or the vias 904 defined in the support frame 102''', as shown in FIG. 13, for example. In some configurations, bonding pads 1401 similar to the bonding pads 906 or 908 described with reference to FIG. 13 can be used at the interface between the backplane substrate 108 and the MLB 118 in order to electrically couple the backplane substrate 108 to the MLB 118.

In FIG. 14, the driver chip(s) 116 can be mounted on the back surface of the backplane substrate 108 within a recess 804 in the MLB 118. The driver chip(s) 116 can be electrically coupled to the electrically conductive traces on the front surface of the backplane substrate 108 through the vias 806 defined in the backplane substrate 108 that extend from the front surface to the back surface of the backplane substrate 108.

Figure 15:
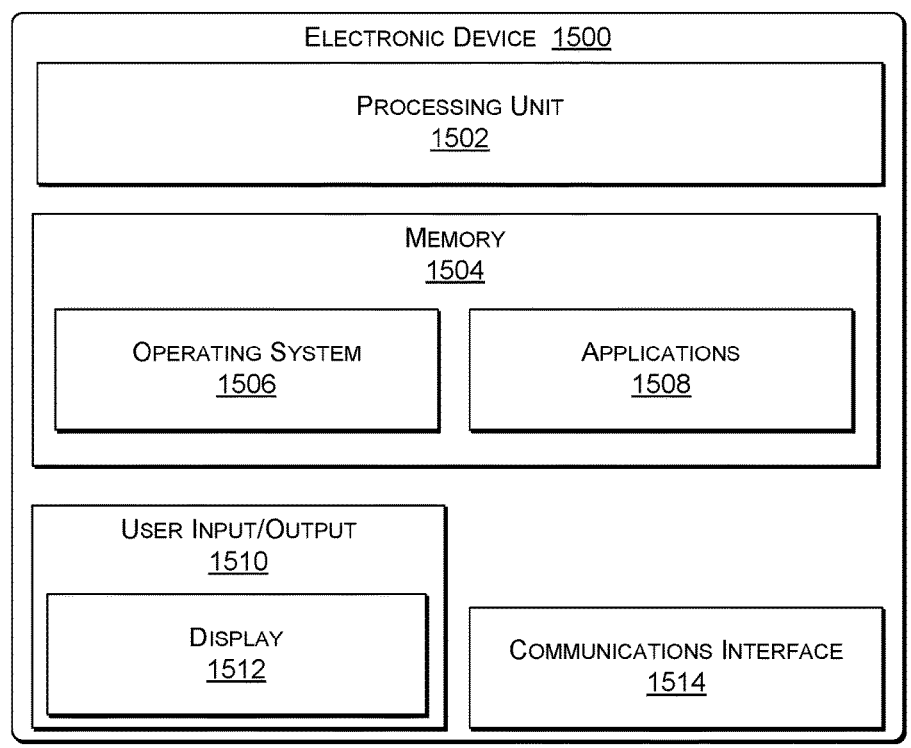
FIG. 15 is a block diagram showing high-level components of an example electronic device that may be used in conjunction with the systems and techniques described herein.

FIG. 15 shows relevant components of an example electronic device 1500 that may be used to implement the systems and techniques disclosed herein. The electronic device 1500 may of course be implemented in many different ways. The electronic device 1500 may comprise any of the above-enumerated devices introduced above.

The example electronic device 1500 may comprise one or more processing units 1502 and one or more forms of computer-readable memory 1504. The memory 1504 may comprise volatile and nonvolatile memory. Thus, the memory 1504 may include, but is not limited to, random access memory (RAM), read-only memory (ROM), electrically erasable programmable ROM (EEPROM), flash memory, or other memory technology, or any other medium which can be used to store applications and data. The memory 1504 may also include removable media such as optical disks, portable devices/drives, and so forth.

The memory 1504 may be used to store any number of functional components, such as programs and program modules that are executable on the processing unit 1502. For example, the memory 1504 may store an operating system 1506 and various applications or user-specified programs 1508. The operating system 1506 and/or the user-specified programs 1508 may include components, modules, and/or logic for performing the actions described herein.

The electronic device 1500 may also have user input/output components 1510, such as a 1512 display (e.g., a touch-screen display), keyboard, mouse, etc. The display 1512 may represent the borderless or thin border display described herein according to various embodiments. The electronic device 1500 may also comprise a communications interface 1514 such as a network interface.

Generally, the functionality described herein may be implemented by one or more electronic devices such as shown by FIG. 15 or by similar devices, with the various actions described above distributed in various ways across the different electronic devices.

It is to be appreciated that the specific dimensions, proportions, shapes and configurations of the components described herein are not specific to the present invention. Furthermore, any of the configurations shown in the figures and described herein can be combined in any suitable combinations. For example, the configurations shown in FIGS. 4, 5, and 6 can be used with the support frame 102" shown in FIG. 10.

CONCLUSION

Although the subject matter has been described in language specific to structural features, it is to be understood that the subject matter defined in the appended claims is not necessarily limited to the specific features described. Rather, the specific features are disclosed as illustrative forms of implementing the claims.

What is claimed is:

1. A display structure comprising:
   a support frame having a cross section of variable thickness, the support frame comprising:
      a center portion, the cross section at the center portion having a first thickness;
      an outer portion having a curved surface, the cross section at the outer portion having a second thickness that is greater than the first thickness; and
      a front surface, at least a portion of the front surface being planar at the center portion;
   a flexible display structure disposed on the support frame, the flexible display structure having a first planar region extending over at least the portion of the front surface and a second curved region extending over the curved surface; and
   a cover lens disposed on the flexible display structure.

2. The display structure of claim 1, wherein:
   the cover lens has a second cross section of variable thickness, the cover lens comprising:
      a first portion disposed over the center portion of the support frame, the second cross section at the first portion having a third thickness; and
      a second portion disposed around the curved surface at the outer portion of the support frame, the second cross section at the second portion having a fourth thickness that is less than the third thickness.

3. The display structure of claim 1, further comprising:
   a light guide disposed on the flexible display structure and between the flexible display structure and the cover lens; and
   a touch panel disposed on the light guide and between the light guide and the cover lens,
   wherein the light guide or the touch panel:
      is disposed over the center portion of the support frame; and
      is not disposed around the curved surface at the outer portion of the support frame.

4. The display structure of claim 1, wherein the flexible display structure comprises:
   one or more electrophoretic layers disposed on a flexible thin film transistor (TFT) array substrate, the flexible TFT array substrate comprising:
      a front surface having electrically conductive traces;
      a back surface opposite the front surface; and
      a plurality of vias extending from the front surface of the flexible TFT array substrate to the back surface of the flexible TFT array substrate,
   the display structure further comprising a driver chip mounted on the back surface of the flexible TFT array substrate and seated within a recess in the center portion of the support frame, wherein the driver chip is electrically coupled to the electrically conductive traces through the plurality of vias.

5. The display structure of claim 1, wherein the support frame further comprises:
   a back surface, at least a portion of the back surface being planar at the center portion, the back surface of the support frame being opposite the front surface of the support frame; and
   a plurality of vias extending through the center portion of the support frame,
   wherein the flexible display structure comprises one or more electrophoretic layers disposed on a flexible thin film transistor (TFT) array substrate, the flexible TFT array substrate comprising:
      a front surface;
      a back surface opposite the front surface; and
      a plurality of bonding pads on the back surface of the flexible TFT array substrate that are in contact with the plurality of vias such that the flexible TFT array substrate is electrically coupled to a main logic board that is disposed behind the support frame and electrically coupled to the plurality of vias at the back surface of the support frame.

6. The display structure of claim 1, wherein:
   the support frame further comprises a back surface, at least a portion of the back surface being planar at the center portion, the back surface of the support frame being opposite the front surface of the support frame; and
   the flexible display structure extends from the front surface of the support frame at the center portion to the back surface of the support frame at the center portion by curving around the curved surface at the outer portion of the support frame.

7. The display structure of claim 1, wherein a radius of curvature of the curved surface is about half of the second thickness.

8. The display structure of claim 1, wherein the curved surface is defined on an additional portion of the front surface of the support frame at the outer portion.

9. The display structure of claim 1, wherein the flexible display structure comprises a flexible electrophoretic display structure, the display structure further comprising:
   a light guide disposed on the flexible electrophoretic display structure and between the flexible electrophoretic display structure and the cover lens; and
   a touch panel disposed on the light guide and between the light guide and the cover lens.

10. A display stack comprising:
   means for supporting, the means for supporting having a cross section of variable thickness, the means for supporting comprising:
      a center portion, the cross section at the center portion having a first thickness;
      an outer portion having a curved surface, the cross section at the outer portion having a second thickness that is greater than the first thickness; and a front surface, at least a portion of the front surface being planar at the center portion;

means for displaying an image on a display, the means for displaying the image being flexible, disposed on the means for supporting, and having a first planar region extending over at least the portion of the front surface and a second curved region extending over the curved surface; and means for protecting, the means for protecting being disposed on the means for displaying the image.

11. The display stack of claim 10, wherein:

the means for protecting has a second cross section of variable thickness, the means for protecting comprising:
- a first portion disposed over the center portion of the means for supporting, the second cross section at the first portion having a third thickness; and
- a second portion disposed around the curved surface at the outer portion of the means for supporting, the second cross section at the second portion having a fourth thickness that is less than the third thickness.

12. The display stack of claim 10, further comprising:

means for guiding light, the means for guiding light being disposed on the means for displaying the image and between the means for displaying the image and the means for protecting; and means for detecting touch events on a front surface of the display, the means for detecting being disposed on the means for guiding light and between the means for guiding light and the means for protecting, wherein the means for guiding light or the means for detecting:
- is disposed over the center portion of the means for supporting; and
- is not disposed around the curved surface at the outer portion of the means for supporting.

13. The display stack of claim 10, wherein:

the means for supporting further comprises a back surface, at least a portion of the back surface being planar at the center portion, the back surface of the means for supporting being opposite the front surface of the means for supporting; and the means for displaying the image extends from the front surface of the means for supporting at the center portion to the back surface of the means for supporting at the center portion by curving around the curved surface at the outer portion of the means for supporting.

14. The display stack of claim 10, wherein:

the curved surface is defined on an additional portion of the front surface of the means for supporting at the outer portion.

15. The display stack of claim 10, further comprising:

means for guiding light, the means for guiding light being disposed on the means for displaying the image and between the means for displaying the image and the means for protecting; and means for detecting touch events on a front surface of the display, the means for detecting being disposed on the means for guiding light and between the means for guiding light and the means for protecting.

16. The display stack of claim 10, wherein the means for displaying the image comprises:

means for containing charged particles disposed on means for driving the display, the means for driving the display comprising:
- a front surface having electrically conductive traces;
- a back surface opposite the front surface; and means for electrically coupling a driver chip to the electrically conductive traces through the means for driving the display.

17. A display structure comprising:

a support frame having a cross section of variable thickness, the support frame comprising:
- a center portion, the cross section at the center portion having a first thickness;
- an outer portion having a curved surface, the cross section at the outer portion having a second thickness that is greater than the first thickness;
- a front surface, at least a portion of the front surface being planar at the center portion; and
- a back surface, at least a portion of the back surface being planar at the center portion, the back surface of the support frame being opposite the front surface of the support frame; and a flexible display structure disposed on the support frame, the flexible display structure extending from the front surface of the support frame at the center portion to the back surface of the support frame at the center portion by curving around the curved surface at the outer portion of the support frame; and a cover lens disposed on the flexible display structure.

18. The display structure of claim 17, wherein the cover lens has a second cross section of variable thickness, the cover lens comprising:
- a first portion disposed over the center portion of the support frame, the second cross section at the first portion having a third thickness; and
- a second portion disposed around the curved surface at the outer portion of the support frame, the second cross section at the second portion having a fourth thickness that is less than the third thickness.

19. The display structure of claim 17, wherein the flexible display structure comprises a flexible electrophoretic display structure, the display structure further comprising:
- a light guide disposed on the flexible electrophoretic display structure and between the flexible electrophoretic display structure and the cover lens; and
- a touch panel disposed on the light guide and between the light guide and the cover lens.

20. The display structure of claim 19, wherein the light guide or the touch panel:
- is disposed over the center portion of the support frame; and
- is not disposed around the curved surface at the outer portion of the support frame.

* * * * *